United States Patent [19]

Van Bavel et al.

[11] Patent Number: 5,541,864
[45] Date of Patent: Jul. 30, 1996

[54] ARITHMETIC-FREE DIGITAL INTERPOLATION FILTER ARCHITECTURE

[75] Inventors: Nicholas R. Van Bavel; Jeffrey W. Scott; Andrew W. Krone, all of Austin, Tex.

[73] Assignee: Crystal Semiconductor, Austin, Tex.

[21] Appl. No.: 233,814

[22] Filed: Apr. 26, 1994

[51] Int. Cl.$^6$ ................................... G06F 15/31
[52] U.S. Cl. ........................................... 364/724.1
[58] Field of Search ......................... 364/724.1, 724.01, 364/724.16, 724.17

[56] References Cited

U.S. PATENT DOCUMENTS

| | | | |
|---|---|---|---|
| 3,997,772 | 12/1976 | Crochiere et al. | 235/152 |
| 3,997,773 | 12/1976 | Van Essen et al. | 235/156 |
| 4,472,785 | 9/1984 | Kasuga | 364/718 |
| 4,561,065 | 12/1985 | Matsuda | 364/724.17 |
| 4,748,578 | 5/1988 | Lagadec et al. | 364/724 |
| 4,791,596 | 12/1988 | Harbich | 364/724.16 |
| 4,851,841 | 7/1989 | Sooch | 341/143 |
| 4,908,621 | 3/1990 | Polonio et al. | 341/120 |
| 4,943,807 | 7/1990 | Early et al. | 341/120 |
| 4,962,380 | 10/1990 | Meadows | 341/120 |
| 5,031,132 | 7/1991 | Dolazza | 364/724.17 |
| 5,061,925 | 10/1991 | Sooch et al. | |
| 5,212,659 | 5/1993 | Scott et al. | 364/724.1 |
| 5,317,529 | 5/1994 | Teraoka et al. | 364/724.1 |

OTHER PUBLICATIONS

R. E. Crochiere and L. R. Rabiner, "Interpolation and Decimation of Digital Signals: A Tutorial Review," *Proc. IEEE*, vol. 69, pp. 300–331 Mar. 1981.
A. B. Oppenheim and R. W. Schafer, "Discrete–Time Signal Processing," Englewood Cliffs, NJ: Prentice Hall, 1989, pp. 105–111.
D. S. K. Chan and L. R. Rabiner, "Analysis of Quantization Errors in the Direct Form for Finite Impulse Response Digital Filter, *IEEE Transactions on Audio and Electroacoustics"*, vol. AU–21, pp. 354–366, Aug. 1973.
E. B. Hogenauer, "An Economical Class of Digital Filters for Decimation and Interpolation," *IEEE Trans. Acoust. Speech, Signal Processing*, vol. ASSP–29, pp. 155–162, Apr. 1981.
T. W. Wong and R. M. Gray, "FIR Filters with Sigma–Delta Modulation Encoding," *IEEE Trans. on Acous., Speech and Signal Processing*, vol. 38, pp. 979–990, Jun. 1990.

Benvenuto et al., "Realization of Finite Impulse Response Filters Using Coefficients +1,0, and –1", IEEE Trans. on Comm., vol. Com–33, No. 10, Oct. 1985, pp. 1117–1125.

*Primary Examiner*—Tan V. Mai
*Attorney, Agent, or Firm*—Gregory M. Howison

[57] ABSTRACT

A low precision Finite Impulse Response filter (FIR) is provided for filtering in a digital interpolation operation. The interpolation operation is comprised of two steps, a sampling rate conversion operation for interspersing zeroes between samples in an input sequence and a filtering step of filtering out images that result from this operation. The filtering operation utilizes a FIR filter that utilizes a low precision set of filter coefficients that are selected to tune the frequency response such that the low end frequency response including the pass band, the transition band, and the portion of the stop band immediately after the transition band provides a response equivalent to that commensurate with substantially higher precision FIR filter coefficients. A second, low pass filter section is provided for filtering the high frequency image energy at the output of the FIR filter to provide an overall filter response commensurate to that utilizing substantially higher precision FIR coefficients. The FIR filter coefficients utilized are restricted to the set of {–1, 0, +1} such that an arithmetic-free realization is provided wherein data is stored in a random access memory (68), with the non-zero coefficients for any interpolator output limited to a predetermined number. This predetermined number equals the maximum clock rate divided by the output sampling frequency. For each interpolator output, addresses of the associated data are stored in a ROM (72), which is operable to sequentially generate the addresses for accessing of data from a RAM (68). The sign is then changed, depending upon a sign change bit in the ROM (72), and then accumulated in an output accumulator (82). After all data is accessed from the RAM (68) for a given interpolator output, the accumulator (82) provides this output to the delta-sigma converter.

57 Claims, 11 Drawing Sheets

ARITHMETIC-FREE DIGITAL INTERPOLATION FILTER ARCHITECTURE

TECHNICAL FIELD OF THE INVENTION

The present invention pertains in general to digital filters and, more particularly, to a finite impulse response filter for use in a digital-to-analog converter.

CROSS REFERENCE TO RELATED APPLICATION

This application is related to U.S. Pat. No. 5,212,659, entitled "Low Precision Finite Impulse Response Filter for Digital Interpolation", issued May 18, 1993, which patent is incorporated herein by reference.

BACKGROUND OF THE INVENTION

Digital-to-analog converters have recently seen an increased use of an oversampled architecture. Oversampled digital-to-analog conversion typically runs four, eight or even sixty-four times faster than the input word rate, requiring a corresponding by higher number of samples to be generated for every input sample. Typically, in this type of architecture, digital or discrete-time interpolation is utilized to provide this increase in the input word rate. In digital interpolation, two distinct steps are utilized. The first step of interpolation is to receive the input sequence x[n], representing the Fourier Transform X[f], at a sample rate of $f_s$. This input sequence x[n] is processed to provide the output sequence y[n], which is essentially the sequence x[n] with M−1 zeroes interspersed between samples, where M is the interpolation factor.

In the frequency domain, the interspersing of zeroes simply rescales the frequency axis. However, the rescaled frequency domain now contains images of the original, low frequency signal. The images can be removed by straightforward, digital low pass filtering, which comprises the second step of the interpolation process. Therefore, the output of the digital low pass filtering step will be the sequence z[n], representing the Fourier Transform Z[f]. The sequence z[n] is the y[n] sequence with the zeroes "filled in". The end result is an interpolator output sequence whose samples occur at a rate that is faster than the input sample rate by a factor of M. The general process of interpolation is disclosed in R. E. Crochiere and L. R. Rabiner, "Interpolation and Decimation of Digital Signals: A Tutorial Review", Proc. IEEE, Vol. 69, pp. 300–331, March 1981, and A. B. Oppenheim and R. W. Schafer, "Discrete-Time Signal Processing", Englewood Cliffs, N.J.: Prentice Hall, 1989. Both of these references are incorporated herein by reference.

The first interpolation step is very conventional and generally comprises the steps of interspersing zeroes between the input samples, which is a relatively straightforward process. However, the second step of digital low pass filtering presents a problem to a hardware designer. Typically, a Finite Impulse Response (FIR) filter of length N is utilized due to the superior phase characteristics and out of band image rejection provided by this type filter. The input to the FIR filter is the y[n] sequence with a second input, the coefficient input, being provided from a storage area that has the coefficients h[0], h1], h2] . . . h[N−1]. This set of filter coefficients completely defines the frequency response of the FIR filter. The number of binary bits required to accurately represent each coefficient is dictated by filter performance parameters, the most sensitive one typically being stop-band rejection. This is disclosed in D. S. K. Chan and L. R. Rabinier, "Analysis of Quantization Errors in the Direct Form for Finite Impulse Response Digital Filters", IEEE Transactions on Audio and Electroacoustics, Vol. AU-21, pp. 354–366, August 1973, which is incorporated herein by reference.

In the case of interpolation, the filter stop-band rejection directly determines the extent to which the out-of-band images will be attenuated. The conventional rule of thumb is about 6 dB of stop-band or image rejection for every binary bit utilized to represent filter coefficients. The conventional filter is realized with a plurality of delay blocks, each having the input multiplied by the associated filter coefficient and then summed, the output rate of the FIR filter being faster than the word rate of the x[n] input sequence by a factor of M. Therefore, the filter must perform N/M multiplies and adds for every output word. Assuming the input data is represented by k binary bits and the FIR filter coefficients are represented by m binary bits, the computational requirement is that at the z[n] output word rate, there are required N/M (k×m) multiplies/adds or, that at the x[n] input word rate, there are required N(k×m) multiplies/adds. For example, if a 16-bit digital audio data input were interpolated from a word rate of 48 kHz to a rate 4× faster, this would result in a word rate of 192 kHz. A digital audio quality FIR filter operating at 4× may have a length N=128 with 14-bit coefficients. The resulting computational burden is 128 (16-bit×14-bit) multiplies/adds at 48 MHz. Note that the computation rate must double for a stereo implementation and, therefore, a single 16-bit×14-bit hardware multiplier must operate at 2×28×48 KHz=12.28 MHz for digital audio quality 4× interpolation.

Since this computation rate is close to the limit for state-of-the-art CMOS technology, and since fast parallel multipliers are too expensive in terms of silicon area to consider utilizing more than one, higher interpolation ratios (M>4) are typically realized in steps. For example, one conventional part number, Part No. SAA7322, manufactured by Philips, provides a stereo CMOS DAC for Compact Discs Digital Audio Systems that realizes a 256× interpolation factor in three separate steps: 4×, 32× and 2×. The first step of 4× is implemented utilizing a multiplier-based 128 tap FIR. The second step of 32× is a simple linear interpolator, and the final 2× step is a zero-order hold. One can safely draw the general conclusion that although the last steps in a multi-step interpolation process can be quite rudimentary, the need for a fast (parallel) digital multiplier of k-bit input data by m-bit filter coefficients has persisted in conventional, digital audio quality interpolation architectures.

In view of the above disadvantages, there exists a need for an interpolation scheme that provides a relatively high precision FIR filter to result in significant rejection in the stop-band without requiring the expensive and complex multipliers of conventional units.

SUMMARY OF THE INVENTION

The present invention disclosed and claimed herein comprises an interpolation filter for filtering a digital input signal sampled at a sampling frequency and providing a filtered digital interpolated output signal. A first memory device is provided for storing the digital input signal. A second memory device is provided for storing filter coefficients that are associated with a Finite Impulse Response (FIR) filter function. The filter coefficients are restricted to only discrete values with the filter coefficients associated with each of the interpolated digital outputs requiring a predetermined number of arithmetic operations in accordance with the FIR filter function. At least one of the arithmetic operations associated with each of the outputs results in a zero value. An operational device is provided for performing all but the at least one of the arithmetic operations. The results output by the operational device are input to an accumulator for accumulation thereof. After all the arithmetic operations are performed for a given digital output, the accumulator provides the digital output value.

In another aspect of the present invention, a defined number of the filter coefficients for each of the digital output signals are set to a "0" value, and the set of arithmetic operations that are performed exclude ones associated with the defined number of "0" filter coefficients. The set of filter coefficients of the remaining ones of the arithmetic operations not included within the set of "0" filter coefficients is restricted to the set of $\{-1, 0, +1\}$, such that the arithmetic device need only change the sign of the selected value from the first memory device when the value of the coefficients is "−1" before input to the accumulator, input the selected value from the first memory device directly to the accumulator for a "+1" filter coefficient value and enter a "0" value to the accumulator for a "0" filter coefficient. Further, the operation is performed in a sequential manner such that no multipliers or additioal adders are required.

In a further aspect of the present invention, the first memory device is comprised of a random access memory having a plurality of storage locations therein that are addressable. The FIR filter coefficients are stored in a read only memory in a predetermined sequence. The sequence is comprised of a plurality of subsequences, with each subsequence associated with one of the digital output values. Each of the subsequences of filter coefficients has associated therewith the address of the stored input sample in the random access memory. When the read only memory is sequenced through each subsequence, the random access memory is addressed, the output value from the random access memory input to the operational device and the operational device controlled by the filter coefficient output by the read only memory to either change the sign, input a zero value or directly input the value to the accumulator.

In a yet further aspect of the present invention, an output filter is provided having a low-pass function. The output filter has a predetermined frequency response having a pass-band droop. This pass-band droop is compensated for by the design of the FIR filter coefficients. Further, the low-pass output filter function is performed in part by the accumulator. This aspect can also applied to providing phase equalization for the output filter, wherein the FIR filter coefficients are designed to compensate for any phase perturbations in the output filter.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
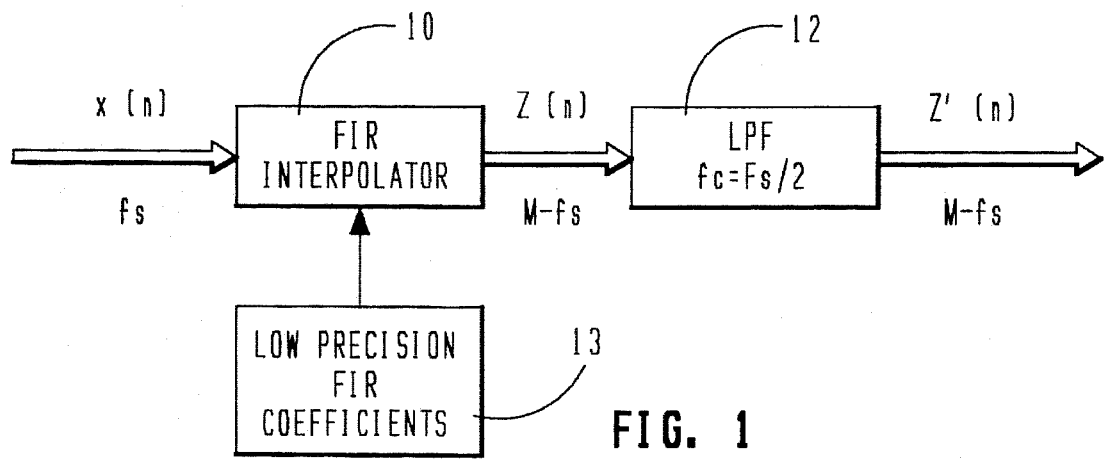
FIG. 1 illustrates a block diagram of the interpolation filter utilizing the low-precision FIR coefficients.

Referring now to FIG. 1, there is illustrated a block diagram of the interpolator of the present invention. The interpolator is generally represented by a block 10 that is labelled "FIR interpolator". The interpolator is comprised of the interpolation block that is operable to intersperse zeroes between the samples in the x[n] input sequence and the filtering step wherein the passband response is defined and the images are partially filtered out. As will be described hereinbelow, this provides the low frequency response which is required for high quality interpolators. This results in the output z[n] sequence, which is a filtered output that is interpolated by a factor M. This is input to a low pass filter block 12, which has a cutoff frequency $f_c$ that is equal to $f_{s/2}$. This results in an output z'[n] that operates at a sampling frequency $Mf_s$. It should be noted that the FIR interpolator 10 operates on low precision FIR coefficients stored in a block 13, which coefficients are utilized to define the frequency response of the filter portion of the FIR interpolator 10 at the low frequency. However, as will be described hereinbelow, the low precision coefficients do not result in a desirable stop band response at higher frequencies. This is achieved with low pass filter block 12.

Figure 2:
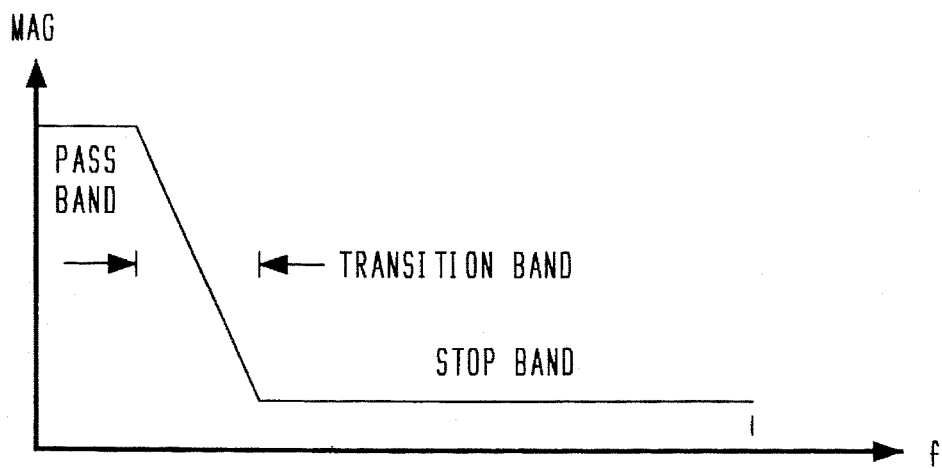
FIG. 2 illustrates the required interpolation frequency response required for the overall interpolation filters.

Referring now to FIG. 2, there is illustrated an overall frequency response for the complete interpolation process. Once the zeroes are interspersed among the samples in the input sequence x[n], it is necessary to provide this type of overall response for applications such as digital-to-analog converters. In the preferred embodiment, the interpolation operation is a single step 64× interpolation with a 1408 tap FIR filter with the FIR filter coefficients restricted to the set $\{-1, 0, +1\}$. The pass band ripple of the filter response is ±0.10 dB, with a pass band definition of +0.20 dB, −0.50 dB. The transition band is a transition between the pass band and the stop band with this existing between $0.442–0.567F_s$. The stop band rejection is desired to be greater than 70 dB. Therefore, a very sharp filter is required, which is the purpose for utilizing a FIR digital filter.

Figure 3A:
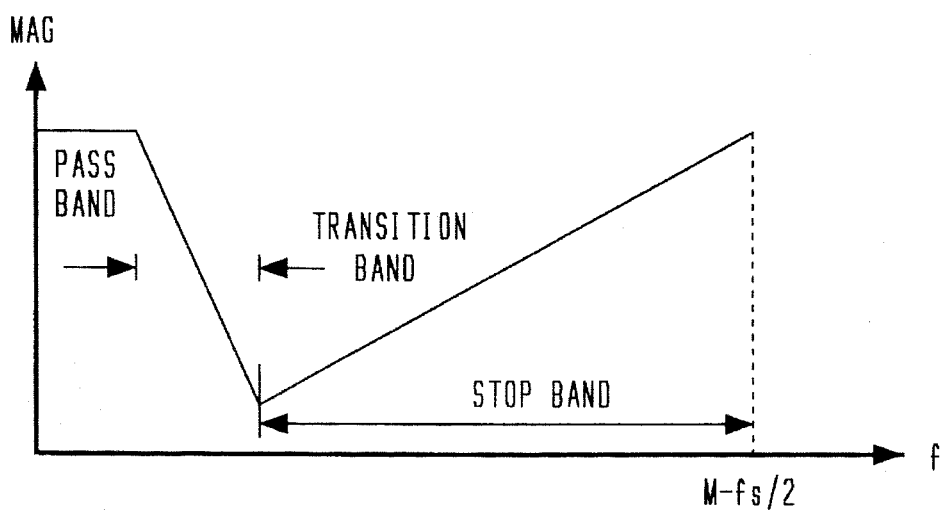
FIGS. 3a and 3b illustrate the frequency responses of the FIR filter with low-precision coefficients and the subsequent low pass filter.

Referring now to FIG. 3a, there is illustrated a frequency plot of the FIR interpolation filter utilized in the present invention. The filter is designed such that the pass band and the transition band meet the overall design requirements for a FIR filter designed with high precision FIR filter coefficients such that, proximate to the transition band, the stop band has a desirable amount of attenuation. However, it can be seen that the attenuation of the stop band above the point proximate to the transition band gradually degrades and is unacceptable. This will be described in more detail hereinbelow.

Figure 3B:
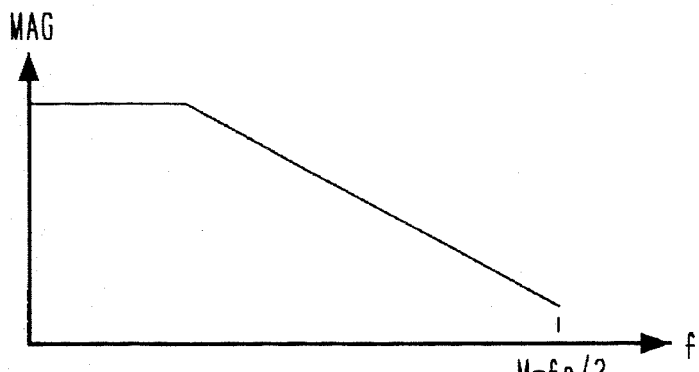

Referring now to FIG. 3b, there is illustrated a frequency response plot for a low pass filter function that is associated with the low pass filter 12 and which filters out the degradation in the stop band that is unacceptable with respect to the frequency response of FIG. 3a. The combination of the response of FIG. 3a and the response of FIG. 3b results in the desired response of FIG. 2. However, the response of FIG. 3a was obtained with very low precision FIR filter coefficients and the response of FIG. 3b was obtained with the use of the relatively straightforward filter design. In the preferred embodiment, the low pass filter 12 is comprised of an output switched capacitor filter operating in the analog domain on a digital-to-analog converter. However, it should be understood that the digital filter function could be implemented in the digital domain at the higher sampling frequency.

Figure 4:
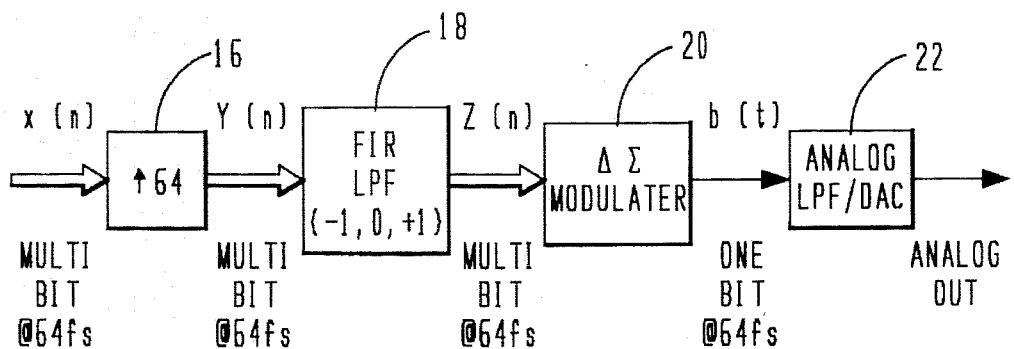
FIG. 4 illustrates a block diagram of the FIR interpolation filter of the present invention, utilizing a digital-to-analog converter.

Referring now to FIG. 4, there is illustrated a functional block diagram of the preferred embodiment of the present invention. The input sequence x[n] is a multi-bit input, typically sixteen bits, that is input to sample rate converter 16 that is operable to increase the sampling rate to a factor of 64× the sampling frequency of the input sequence x[n]. This results in an output sequence of y[n] that is also a multi-bit signal. The sequence y[n] is input to a FIR low pass filter 18, which has FIR filter coefficients restricted to the set {−1, 0, +1} for each stage of the filter, as described above. The FIR low pass filter 18 is operable to filter out the images resulting from the interspersing of zeroes in the sample rate converter 16. This results in the filtered sequence z[n], which is also a multi-bit sequence operating at 64× the sampling frequency. This is input to a conventional delta-sigma modulator 20 that is operable to output a digital 1-bit output at 64× the sampling frequency, which output is then input to an analog low pass filter/1-bit digital-to-analog converter (DAC) 22. This provides the analog output of the overall digital-to-analog converter. As will be described hereinbelow, the sample rate converter 16 and filter 18 are implemented with a single RAM device, with a final accumulator and coefficients stored in ROM.

Figure 5A:
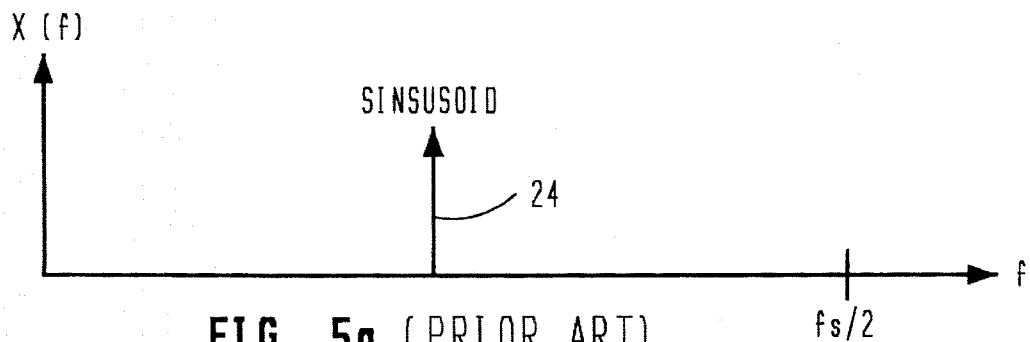
FIGS. 5a–5e illustrate the frequency response plots for the various stages of the embodiment of FIG. 4.
Figure 5B:
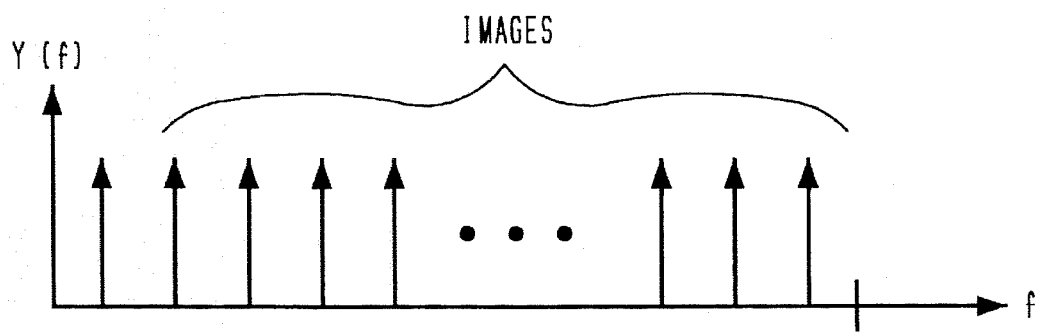
Figure 5C:
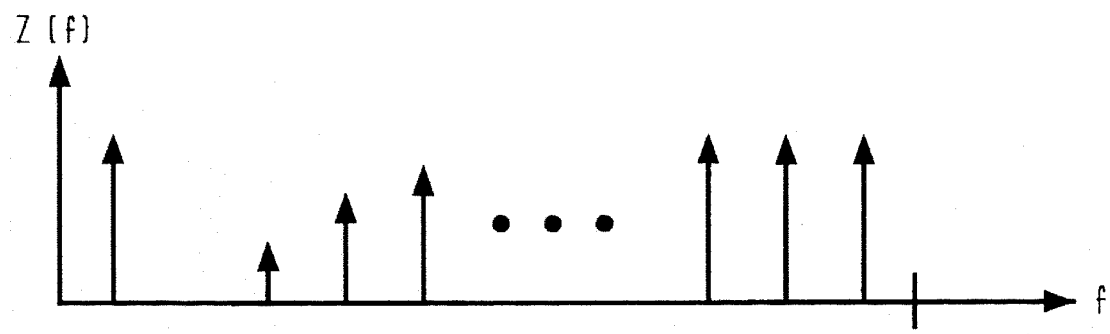
Figure 5D:
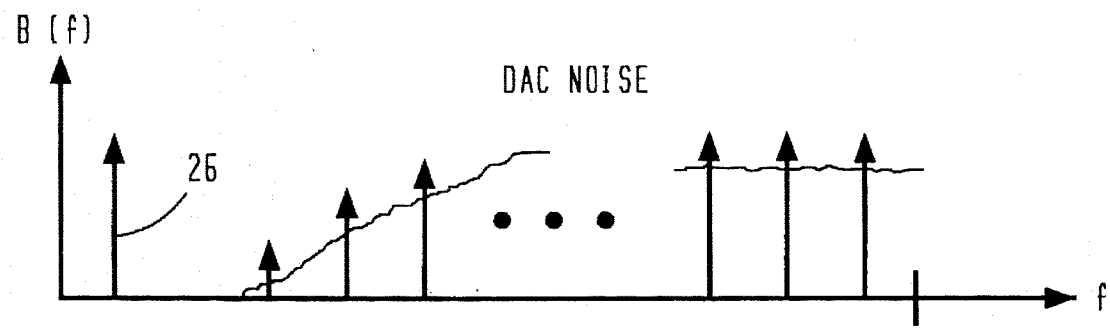
Figure 5E:
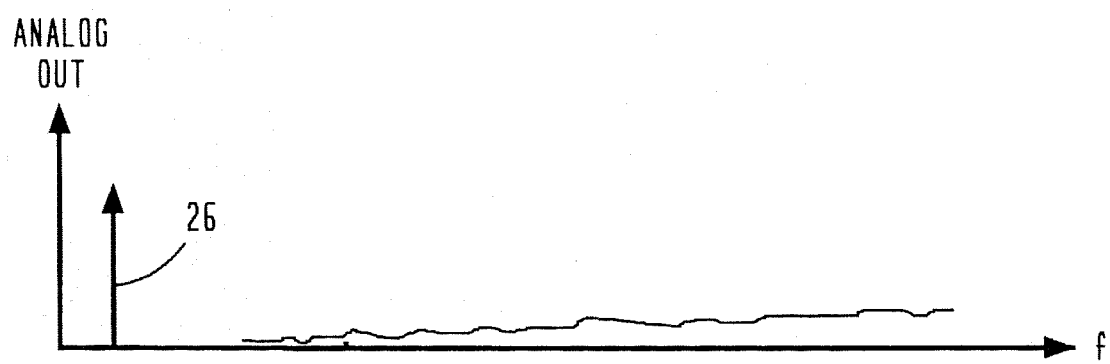

Referring now to FIGS. 5a–5e, there are illustrated frequency plots for each step of the conversion process. FIG. 5a illustrates the frequency response X[f], which is the frequency response for the input data. As expected, this is merely a sinusoid with a single frequency component 24 in the frequency spectrum. It can be seen that this is substantially less than $f_s/2$. FIG. 5b illustrates the frequency response for the sinusoid of FIG. 5a at the output of the sample rate converter 16, illustrating the images of the sinusoid that result after the interspersing of zeroes between the samples in the x[n] input sequence. FIG. 5c illustrates the output of the FIR low pass filter 18 with the low precision FIR coefficients, where it can be seen that the sinusoid is passed through the pass band, as illustrated by a frequency component 26, and the remaining images are filtered out with the images most proximate to the transition band and just outside the pass band, being heavily attenuated, and the remaining images being less heavily attenuated in a gradual manner. FIG. 5e illustrates the output of the analog low pass filter/DAC 22, wherein all of the images in the stop band are significantly attenuated. Therefore, it can be seen that the use of the low precision FIR low pass filter, that provides the desired low frequency response in the pass band and about the transition band, can be combined with the low pass filter to result in an overall frequency response that is equivalent to that of a high precision FIR low pass filter for utilizing multi-bit FIR coefficients. For example, a high precision FIR low pass filter could require in excess of fourteen bits for each coefficient, which would require relatively complex multiplier stages in the circuitry that is utilized to realize the FIR low pass filter.

Figure 6:
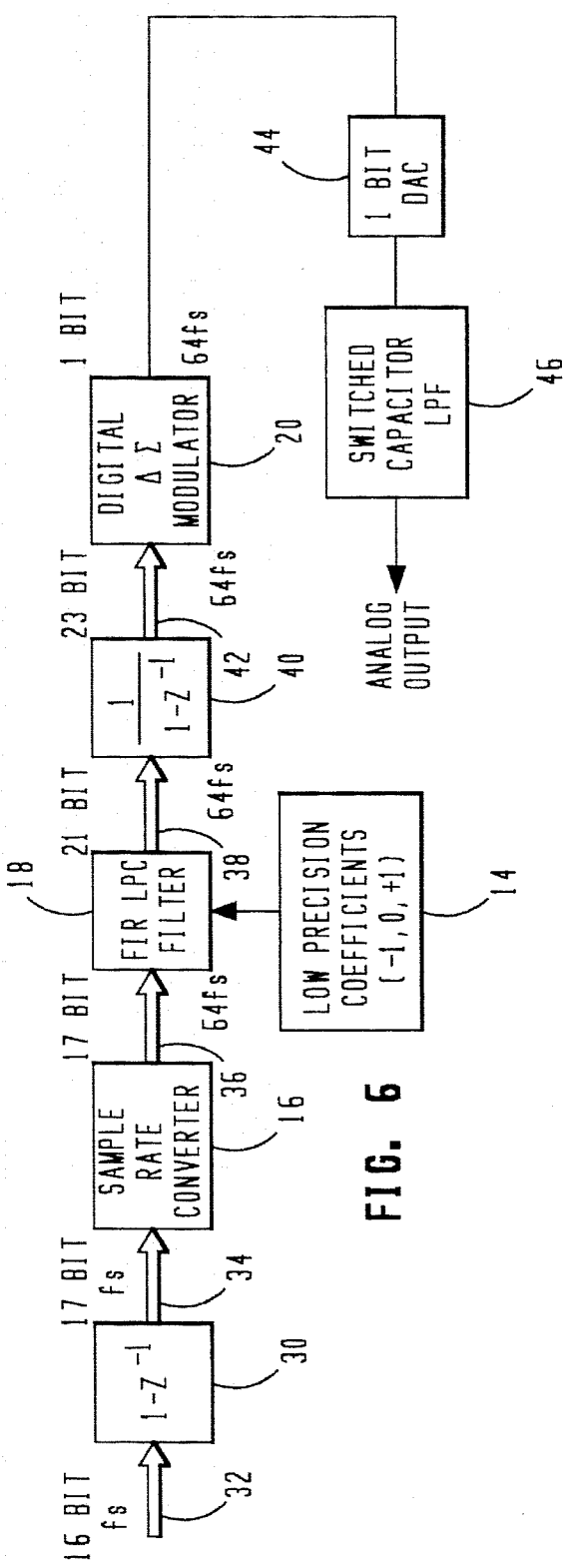
FIG. 6 illustrates the preferred embodiment of the present invention.

Referring now to FIG. 6, there is illustrated the preferred embodiment of the digital-to-analog converter utilizing the low precision FIR low pass filter. The output of the FIR low pass filter 18 results in high frequency images that approach or exceed the magnitude of the pass band sinusoid. It would therefore be anticipated that the operation of a digital delta-sigma modulator 20 would be degraded due to the image energy at the high end of the stop band being input to the digital delta-sigma modulator. To prevent this, a relatively simple image attenuating digital filter is provided after the low precision coefficient FIR low pass filter 18 to reduce these stop band images. To attenuate these high frequency images, the filter need only attenuate the gradual rise in the image energy resulting from the use of the low pass filter 18 with the low precision coefficients. The filter that is utilized in the present invention is a zero-order hold or SINC filter. This filter is described in E. B. Hogenauer, "An Economical Class of Digital Filters for Decimation and Interpolation", IEEE *Trans. Acoust. Speech, Signal Processing*, Vol. ASSP-29, pp. 155–162, April 1981, which reference is incorporated herein by reference. The zero-order hold filter provides an impulse response that is defined by the following transfer function:

$$H(z) = \frac{1}{N} \left( \frac{1 - z^N}{1 - z^1} \right) \quad (1)$$

When N in the zero-order hold transfer function that is equal to the oversampling or interpolation ratio M, this filter is relatively easy to implement. It utilizes a low speed differencing block 30 that provides the transfer function "$1-z^{-1}$", which operates at the input sampling frequency. The input sequence x[n] is a 16-bit word input on a bus 32 to the input of the block 30. The output of the block 30 is provided on a bus 34, which comprises a seventeen-bit output operating at the sampling frequency $f_s$. This is input to the sampling rate converter 16. The sampling rate converter 16 is then operable to increase the sampling rate by a factor of 64 to provide a seventeen-bit output on a bus 36. This is then input to the FIR low pass filter 18 that utilizes low precision FIR filter coefficients stored in the coefficient memory 14. This will then provide a digitally filtered output on a bus 38 that is a twenty-one-bit output operating at 64× the sampling frequency $f_s$. This is input to a high speed accumulator 40, having a transfer function equal to:

$$\frac{1}{1 - z^{-1}} \quad (2)$$

The high speed accumulator 40 operates at 64× the input sampling frequency, whereas the difference block 30 operates at the lower speed sampling frequency. The combination of the accumulator 40 and the difference block 30 provide the zero-order hold filter function, which is sometimes referred to as a Comb-Integrate-Cascade filter (CIC).

One disadvantage to the utilization of the zero-order hold filter having an impulse response length equal to the interpolation function ratio is that a pass-band droop of approximate 4 dB results. However, this can be compensated for in the design of the FIR filter by being designed to offset this pass-band droop.

The output of the accumulator 40 is a twenty-three-bit output, operating at 64× the sampling frequency $f_s$, which is output on a bus 42 to the digital delta-sigma modulator 20. The one-bit output of the modulator 20 is then input to a one-bit digital-to-analog converter 44 and then to a switched capacitor low pass filter 46. This provides the analog output. The design of the one-bit digital-to-analog converter 44 and the switched capacitor low pass filter 46 is described in U.S. Pat. application Ser. No. 07/571,376, filed Aug. 20, 1990, now issued as U.S. Pat. No. 5,061,925, which is incorporated herein by reference. The 5,061,925 patent also discloses a phase equalization technique which is also utilized in the digital-to-analog converter of the present invention. In this manner, the overall phase and frequency response of the FIR filter 18 and the switched capacitor filter 46, which is an Infinite Impulse Response Filter (IIR), are designed together such that phase deficiencies in either filter can be compensated by the design of the other filter.

Figure 7:
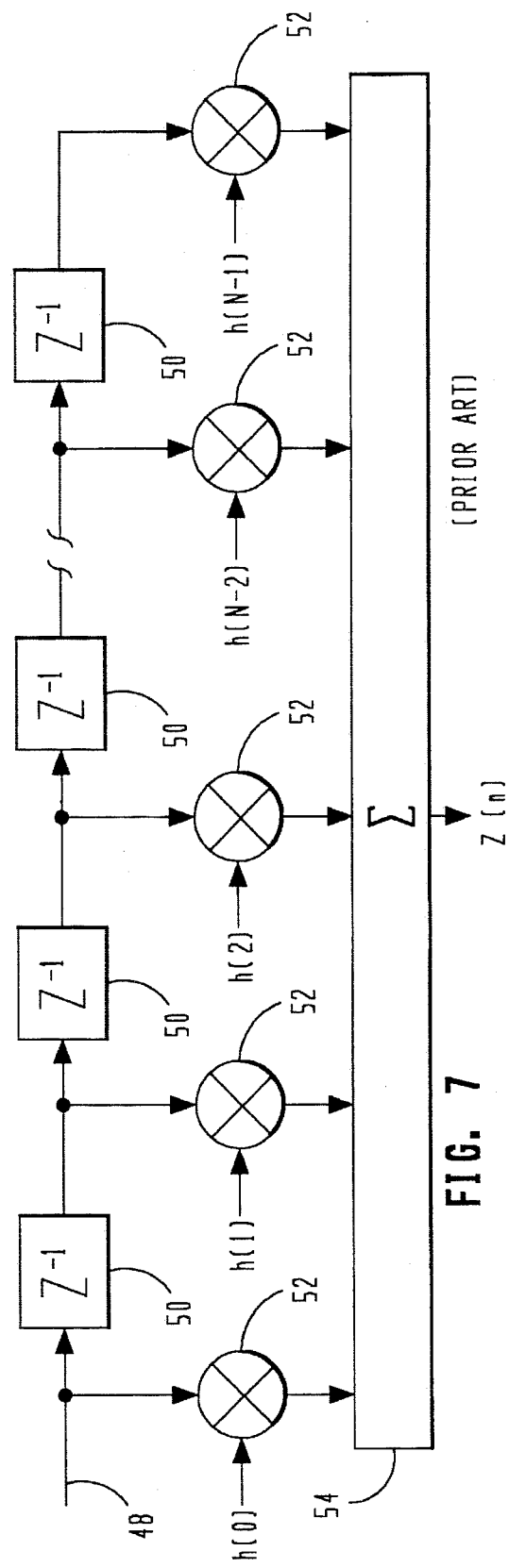
FIG. 7 illustrates a block diagram of the FIR interpolation filter.

Referring now to FIG. 7, there is illustrated a block diagram of a conventional FIR filter of filter length N. The input sequence y[n] is received on an input 48 and input to a sequence of delay blocks 50, each providing a delay of "$z^{-1}$". Input y[n] is also input to one of a series of multipliers 52, which input is multiplied by a FIR filter coefficient h[n]. The output of this multiplier 52 is then input to a summing block 54 to perform an addition operation. The output of each of the subsequent delay blocks 50 are also input to an associated one of the multipliers 52 and multiplied by successive ones of the filter coefficients. The output of each of the multipliers 52 is input to the summing block 54 that provides the addition operation. The output of the summing block 54 provides the output sequence z[n].

If the FIR coefficients are consistent with the design of a high precision FIR filter, they will have a word length in excess of fourteen bits. Whenever utilizing a multi-bit FIR coefficient, this results in the requirement for a relatively complex multiplication block. This is due to the fact that a number of shifting operations and addition operations will be required in accordance with conventional digital multiplication techniques. It is one important aspect of the present invention to reduce this complexity, if not eliminate it. In the preferred embodiment of the present invention, the FIR filter utilized to perform the low pass filtering function on the output of the interpolator to adequately attenuate the first out-of-band image is designed utilizing very trivial coefficients restricted to the set {−1, 0, +1}. However, it could have been designed restricted to the set coefficients restricted to the set {−1, +1} or {−2, −1, 0, +1, +2}.

For a conventional 2048 tap FIR filter utilizing 64× interpolation, the filter will have 2048/64=32 words of non-zero input data in the tapped delay line in any given instance. If one ignores the fact that some coefficients in the h[n] set are zero instead of ±1, each interpolator output requires a selective summation of thirty-two input data words. If one were to assume that 256 $f_s$ is the maximum available clock rate for performing the required additions, the total number of clock cycles available for each 64 $f_s$ interpolator output is four. Therefore, the required number of hardware adders would be eight, which is four clock cycles for each thirty-two additions per interpolator output. If, on the other hand, a 512 $f_s$ clock were available for an equivalent 2048 tap FIR realization, the hardware requirement would be reduced to four adders per every channel.

Although the hardware requirements are reduced by utilizing a higher speed clock to minimize the number of adders that are required and the non-trivial set of coefficients that alleviate the need for multipliers, some hardware is required in the form of adders to generate the appropriate inputs to the accumulator. As will be described in detail hereinbelow, the h[n] coefficient set has a large number of zeroes associates therewith. The large number of zeroes can be utilized to reduce the number of adders to zero.

An important aspect of the present invention is storage of the interpolator data in a random access memory (RAM) to allow random accesses for each interpolator output. Since each operation merely requires accessing of the data and changing of its sign prior to input to the accumulator, the number of operations are minimized. Further, only the input data words that correspond to "non-zero" coefficients of the FIR filter are accessed. There is no need to access an input data word if it is merely being multiplied by zero.

By way of background, in a single frame, the interpolator output z[n] can be expressed as illustrated in Table 1:

TABLE 1 z[0] = y[1] * h[0] + y[2] * h[64] + y[3] * h[128] + . . .
z[1] = y[1] * h[1] + y[2] * h[65] + y[3] * h[129] + . . .
.
.
.
z[63] = y[1] * h[63] + y[2] + * h[127] + y[3] * h[191] + . . .

where, y[k] is the input data and h[n] is the set of FIR coefficients belonging to the trivial set {−1, 0, +1}. A normal convolution implementation would access every y[k] and multiply it by the corresponding h[n], whether it was zero or not. In the present invention, only the y[k] that are multiplied by "non-zero" h[n] are accessed. Since a great number of h[n] are zero for the {−1, 0, +1} set of FIR filter coefficients, this can significantly reduce the number of addition operations that are required to calculate the z[n] outputs.

Figure 8:
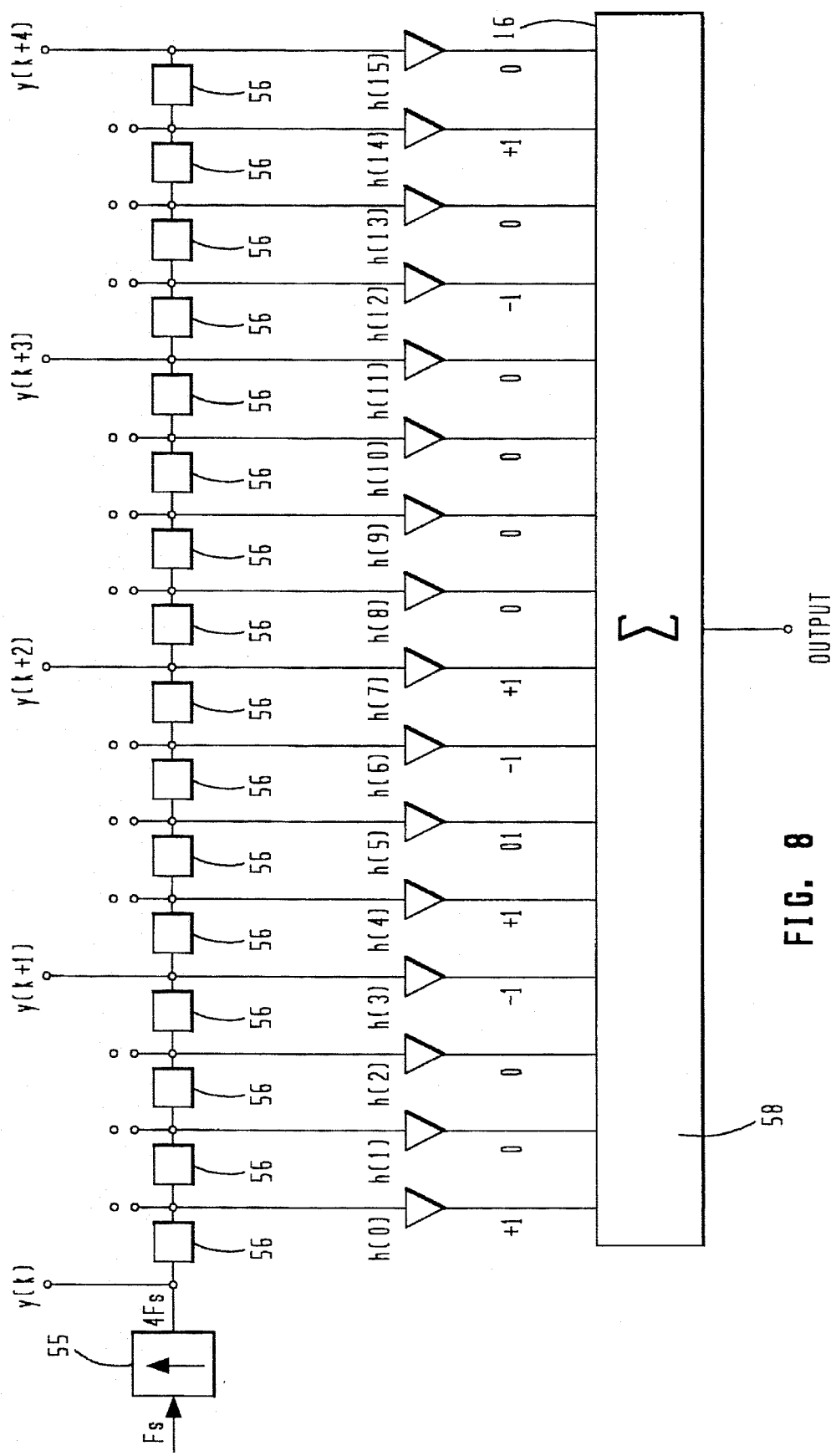
FIG. 8 illustrates a more detailed block diagram of the interpolator of the present invention.

Referring now to FIG. 8, there is illustrated a 4× interpolation filter with a length of sixteen. There are four data words from the input stream y(k+1), y(k+2), y(k+3) and y(k+4), that are input and shifted through the delay line formed of a plurality of delay blocks 56. There are sixteen coefficients, h[0]–h[15] in the nontrivial set {+1, 0, −1}. There are only four non-zero inputs for the data position in the delay line which need to be calculated. These are associated with the coefficients h[3], h[7], h[11] and h[15]. However, the coefficient h[15] and the coefficient h[11] are equal to zero, with the coefficient h[7]=+1 and the coefficient h[3]=−1. For this set of coefficients, only two additions are actually required. However, it can be seen that for the next interpolator output, the data is shifted over one delay line such that the input value y[k] is now input to the h[0] coefficient block and so forth. Depending on the coefficient set, some outputs may require the entire four additions and some may require as little as one addition. The additions are performed in an accumulator 58 to provide an output therefrom at the 4 $f_s$ sampling rate to the delta-sigma converter. It should be understood that the above description was for illustrative purposes, as a filter of length sixteen would not suffice in a data conversion application since it could not be realized with low precision coefficients.

Figure 9:
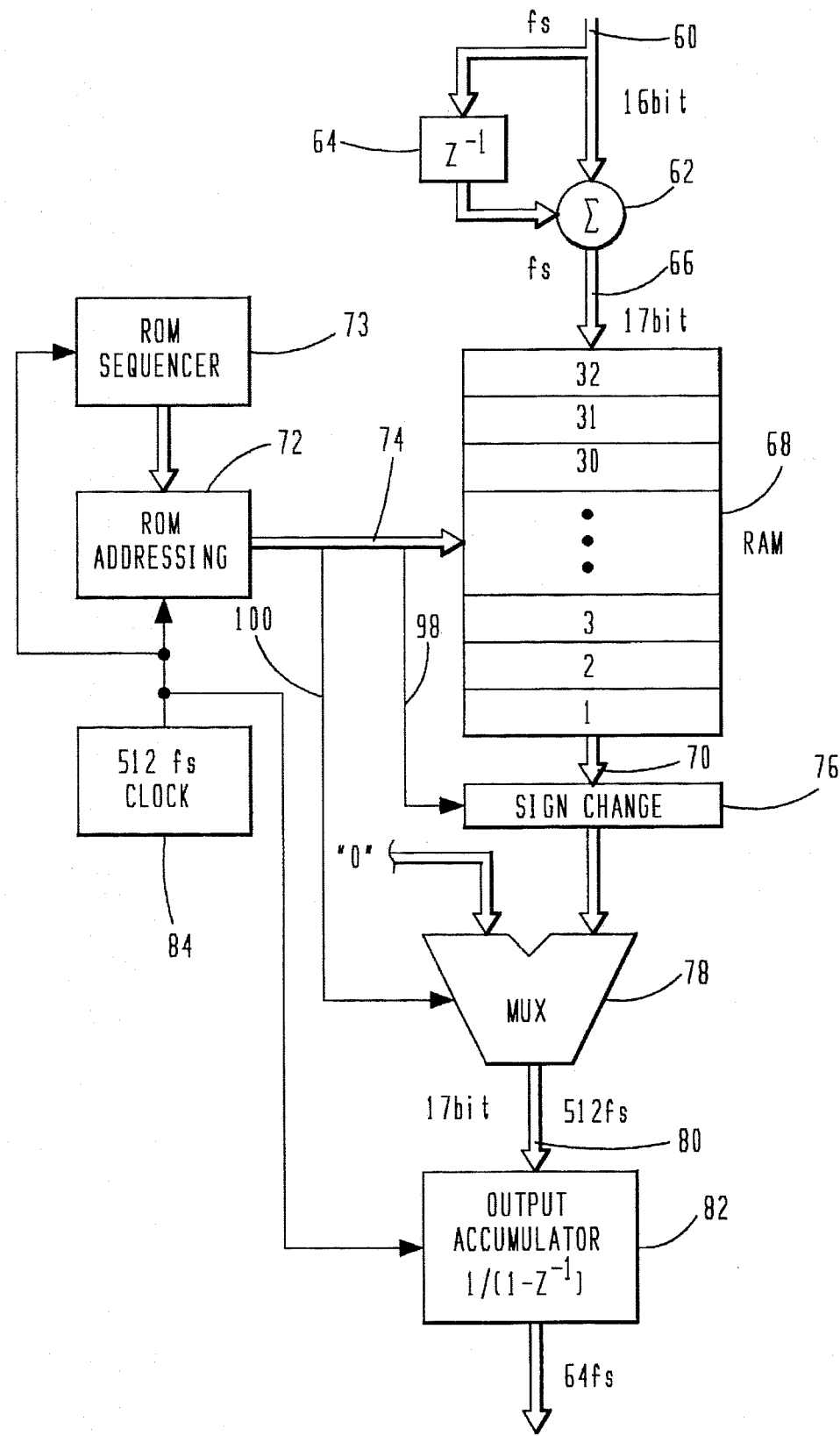
FIG. 9 illustrates a block diagram of the preferred embodiment.

Referring now to FIG. 9, there is illustrated a block diagram of the preferred embodiment of the FIR filter. The input data stream at sampling frequency $f_s$ is received on an input data bus 60 and input to an adder 62. The input data on the input data bus 60 is also processed through a delay block ($z^{-1}$) 64, the output thereof input to a negative input of the adder 62 such that the adder 62 performs a subtraction operation. This provides the difference between the input data on bus 60 and the output of the delay block 64 on a bus 66 as a 17-bit data word. This data is then input to a random access memory (RAM) 68, which RAM 68 allows for storage of thirty-two words of 17-bit data to allow the possibility of implementing the 2048 tap filter. However, as will be described hereinbelow, the preferred embodiment utilizes a filter that is 1408 taps.

The RAM 68 is illustrated as being a dual port RAM having an input bus 66 and an output bus 70. The RAM 68 is addressed for output purposes by a ROM 72, which provides on the output thereof an address input for the RAM 68 on an address bus 74. In the dual port RAM 68, an address will also be provided on the input associated with the bus 66, although it is not shown. However, the RAM 68 illustrated in FIG. 9 could be a single conventional RAM wherein the address bus to the RAM 68 is multiplexed for the input operation and the output operation. In this mode, the data would first be input to the RAM 68 in one cycle and then accessed in another cycle using the same address bus and the same data bus, with the address and data buses multiplexed. Again, this is a conventional operation.

For the output operation, the output data bus 70 from the RAM 68 is input to a sign change block 76 which is operable to selectively change the sign of the data, the output thereof input to one input of a two-input multiplexer 78. The other input of the multiplexer 78 is connected to a "0" digital value. Therefore, the multiplexer 78 selects from a "0" value or the output of the sign change block 76 to provide on the output thereof a 17-bit word on a data bus 80. However, as will be described hereinbelow, this output is at a much higher rate, a rate of 512 $f_s$. This is input to an output accumulator 82, which output accumulator effectively provides the function:

$$\frac{1}{(1-z^{-1})} \quad (3)$$

The output accumulator 82 is sampled on the output thereof at a rate of 64 $f_s$ by the delta-sigma converter.

The data in the RAM 68 is accessed at eight times the 64 $f_s$ clock rate, although it is input in the $f_s$ clock sampling rate. This therefore requires a 512 $f_s$ clock 84 to be present. This clock is utilized to control the ROM 72 and the output accumulator 82. The ROM is operable to selectively address the ones of the data words that are to be multiplied by "non-zero" coefficients, and since the coefficient set is restricted to the trivial set {−1, 0, +1}, it is only then necessary to change the sign of the output data if it is a negative coefficient.

The coefficient set is selected such that only eight data words will be multiplied by "non-zero" coefficients wherein each interpolator output requires only eight additions, as compared to thirty-two additions. Of course, if a faster clock were available, more additions could be performed. Additionally, if one of the sets of coefficients for any of the interpolator outputs results in less than eight multiplications with "non-zero" coefficients, this will of course be a "0" value and the multiplexer 78 is utilized to select the "0" value for output.

The ROM 72 is controlled with a ROM sequencer 73, which is operable to sequentially address the word locations in the ROM 72. For each frame, the storage locations in the ROM 72 are completely sequenced through by sequentially stepping through the addresses of the ROM 72. At the end of the sequence, i.e., the end of the frame, the ROM sequencer 73 is reset and then the data stored in the RAM 68 incremented, such that the oldest data sample is discarded and a new data sample stored in a First-In-First-Out (FIFO) manner. This will begin the next frame.

Figure 10:
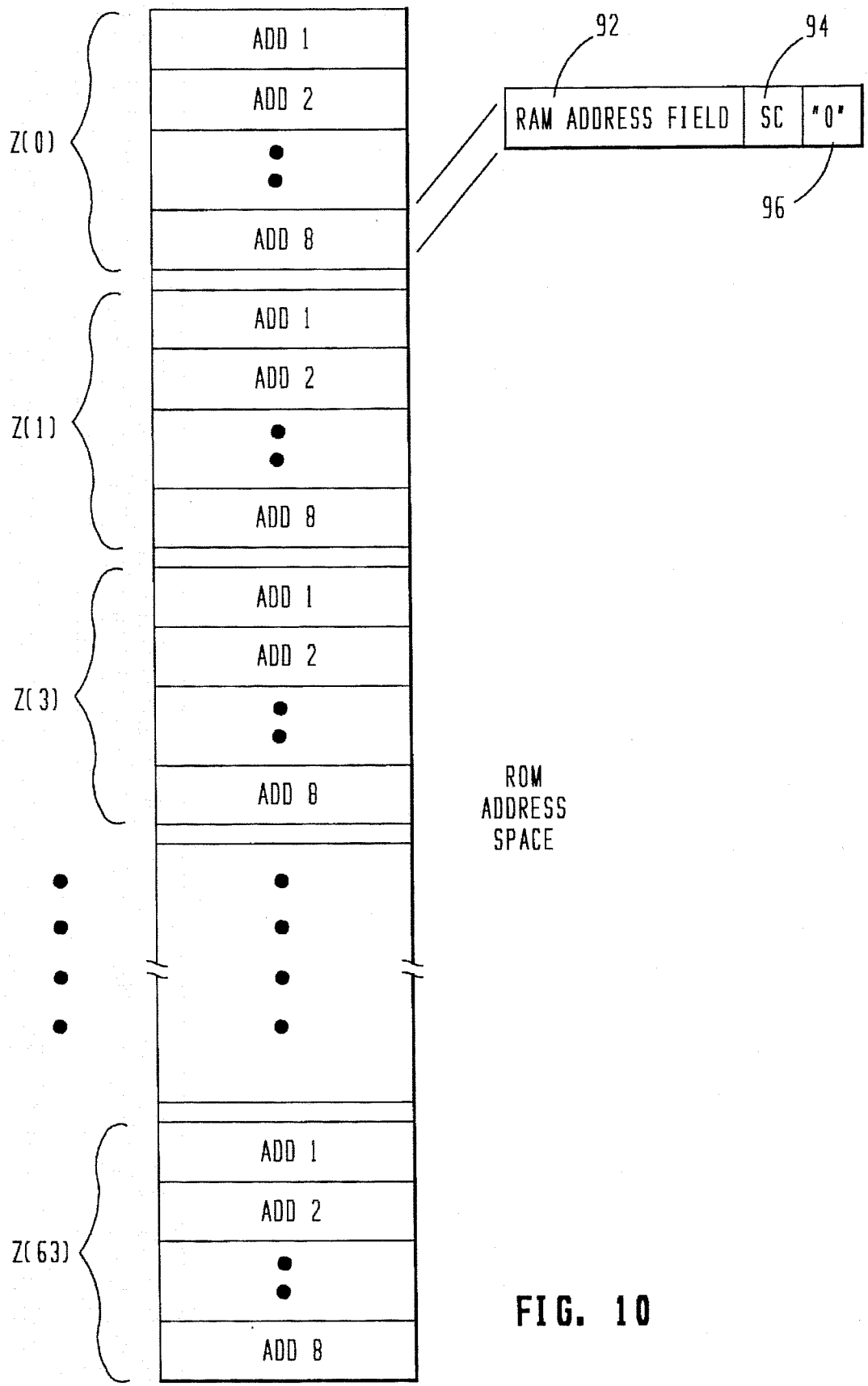
FIG. 10 illustrates a diagrammatic view of the ROM address space.

Referring now to FIG. 10, there is illustrated a diagrammatic view of the ROM address space. The ROM address space is arranged such that each interpolator output z[n] has eight addresses associated therewith. The eight addresses each comprise three fields, a RAM address field 92, a sign change bit field 94 and a "0" field 96. The RAM address field 92 defines the address of the RAM that is input on the bus 74, the sign change bit field 94 comprises a single bit that is output on a line 98 to the sign change block 76 to indicate whether the sign is to be changed. If the bit is set high, this indicates a negative operation and if the bit is set "low", this indicates a positive operation wherein the sign is not changed. If the bit in the "0" field 96 is set high, this indicates that the multiplexer 78 is to have the "0" value passed therethrough. This field 96 has the output thereof connected to a line 100 to the input of a multiplexer 78 to control the operation thereof.

The ROM address space is arranged such that the first eight ROM addresses are associated with the first interpolator output z[0] and the last eight addresses stored therein are associated with the z[63] output. The ROM 72 is controlled to output the data in a sequential manner at a rate of 512 $f_s$ as controlled by the clock 84 utilizing an input address counter (not shown). This allows the ROM 72 to operate in the most efficient manner. Therefore, it is only necessary to sequence the ROM 72 from its initial address through 512 cycles and then reset the ROM sequencer 73.

Figure 11:
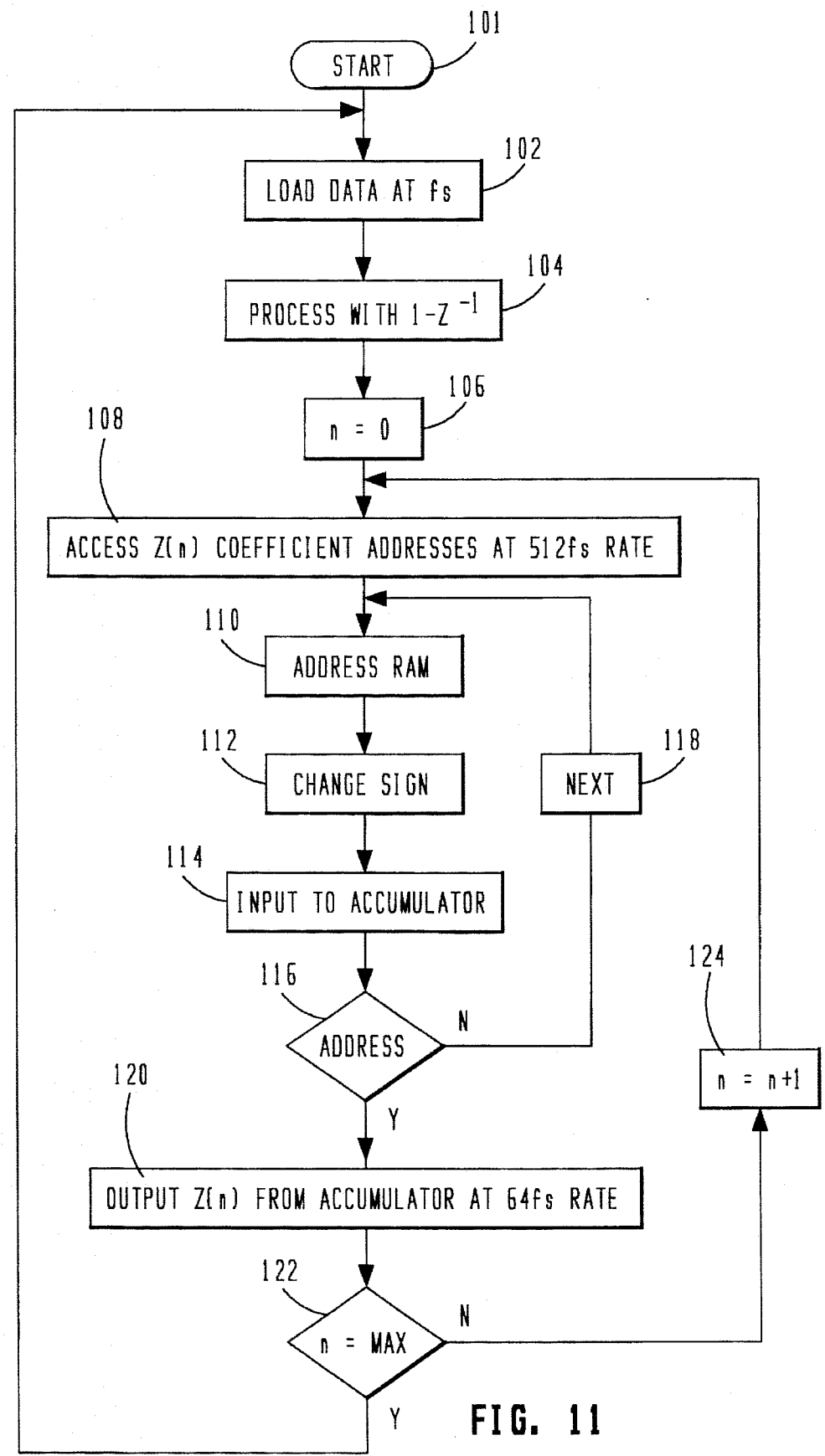
FIG. 11 illustrates a flowchart for the overall process flow.

Referring now to FIG. 11, there is illustrated a flowchart depicting the overall process flow. The flowchart is initiated at a start block 101 and then proceeds to a function block 102 wherein data is loaded at the sampling frequency $f_s$. The program then flows to a function block 104 to process the data during loading with the function $(1-z^{-1})$. The program then flows to a function block 106 to set the value of an arbitrary designator "n" to zero, and then flows to a function block 108. The function block 108 begins the access operation for the first interpolator output z[n] at the sampling rate 64 $f_s$. The addresses associated with each of the z[n] outputs are accessed at the 512 $f_s$ rate. The program then flows to a function block 110 to address the RAM 68 and then to a function block 112 to change the sign of the data output from the RAM 68. The program then flows to a function block 114 to input the data to the accumulator 82, again at the 512 $f_s$ rate. The program then flows to a decision block 116 to determine if the address number eight has been reached. If not, the program flows along an "N" path through a function block 118 to select the next address and then back to the input of function block 110. This continues until all eight address have been accessed for a given output z[n], the RAM 68 addressed and the sign of the output value changed if necessary. At this point in time, the program will flow along the "Y" path to a function block 120 to output the accumulated value from the accumulator 82 at the 64 $f_s$ rate. The program then flows to a decision block 122 in order to determine if the value of "n" is equal to a maximum. If not, the program flows along an "N" path to a function block 124 to increment the value of "n" by one and then back to the input of the function block 108 to begin the operation for the next interpolator output. When the value of "n" is equal to a maximum, this indicates the completion of the operation on the loaded data and then the program flows back to the input of function block 102 to load the next data word at the beginning of a new frame.

In the preferred embodiment, it is important to determine what length FIR filter can be designed and trivialized such that each interpolator output requires at most eight non-zero summations of input data. At present, the longest known FIR filter has a length of 1408 taps, for which a sparsity-ignorant implementation would demand 1408/64=22 operations per interpolator output. For this type of filter, the use of the arithmetic-free interpolation architecture would reduce the number of additions required by 64%. In this configuration, only 22 words of data need to be loaded into the RAM, as compared to 32 words for a 2048 tap filter.

Figure 12:
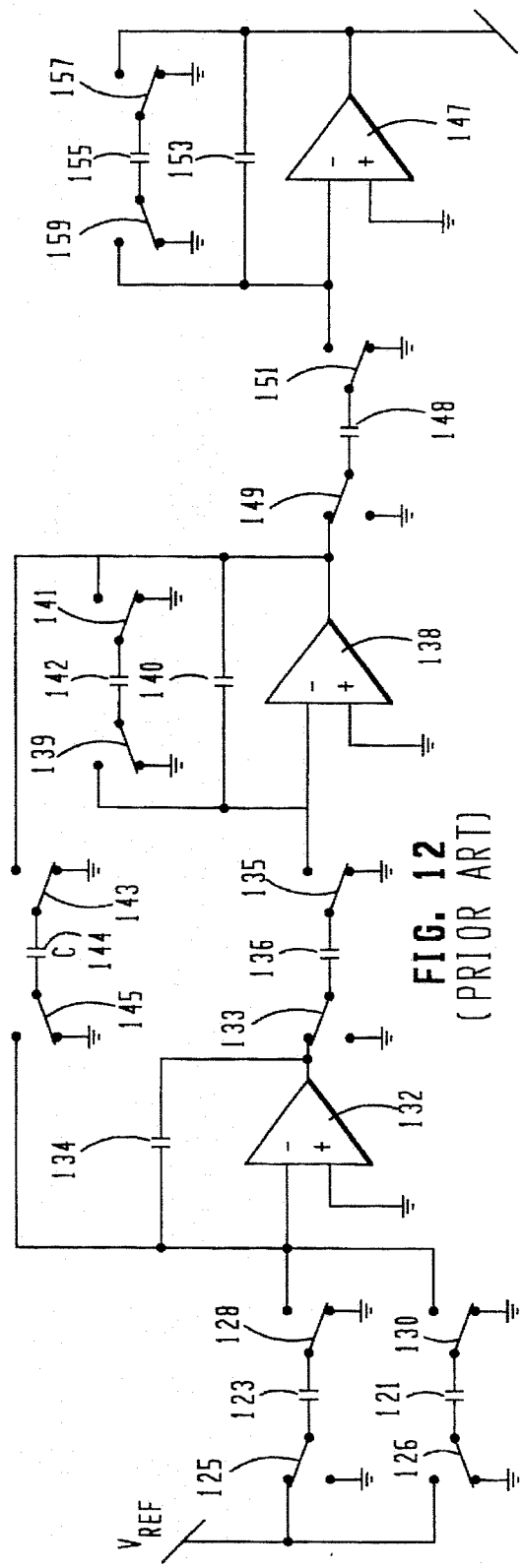
FIG. 12 illustrates a block diagram of the switched capacitor analog low pass filter and one-bit DAC utilized in the output section.

Referring now to FIG. 12, there is illustrated a detailed logic diagram of the switched capacitor filter 46 and the one-bit DAC. The one-bit DAC is comprised of a capacitor 121 and a capacitor 123 and voltage reference $V_{REF}$. Two switches 125 and 126 are provided, having two poles, one connected to $V_{REF}$, and one connected to ground. Each of the switches 125 and 126 has a switching arm connected to one side of capacitors 123 and 121, respectively. The other side of capacitors 123 and 121 are connected to the switching arms of switches 128 and 130. Switches 128 and 130 have two poles, one connected to ground and one connected to the input of a switched capacitor filter. In operation, capacitor 123 has one of its plates connected to the positive voltage and one of its plates connected to ground and then switches the one plate to ground and the other plate to the input of the switched capacitor filter. When the capacitor 122 is configured to have the one plate associated with switch 128 connected to ground and the one plate associated with switch 125 connected to the positive voltage, both plates of capacitor 121 are connected to ground. When the charge is transferred to the input of the switched capacitor filter, the one plate of capacitor 121 associated with switch 126 is connected to a positive voltage and the one plate of the capacitor 121 associated with switch 130 is connected to the input of the switched capacitor filter. This is a conventional 1-bit DAC.

The switched capacitor filter is a third order Butterworth low pass filter that is comprised of three switched capacitor stages. The first stage is comprised of an amplifier 132 having a negative input connected to one pole of switches 128 and 130 and the positive input thereof connected to ground. A capacitor 134 is connected between the output of amplifier 132 and the input thereof. A capacitor 136 has the plates thereof connected to the switching arms of switches 133 and 135. Capacitor 136 operates in a switched capacitor configuration with one plate tied to ground and the other plate tied to the non-ground pole. Switch 133 switches the one plate of capacitor 136 between the output of amplifier 132 and ground and switch 135 switches the other plate of capacitor 136 between the negative input of a second amplifier 138, associated with the second stage, and ground. The positive input of amplifier 138 is connected to ground. A capacitor 140 is connected between the negative input and the output of amplifier 138, and a switched capacitor 142 is disposed between the negative input and the output of amplifier 138 and switched between the input and output thereof and ground through switches 139 and 141, such that in one mode it is connected in parallel with capacitor 140 and, in another mode, has both plates connected to ground.

A switched capacitor 144 is connected between either the output of amplifier 138 and the negative input of amplifier 132 or ground through switches 143 and 145, such that either both plates are connected to ground or the capacitor is disposed across the output of amplifier 138 and the negative input of amplifier 132. A third amplifier stage 147 is provided, with a switched capacitor 148 connected in a switched configuration between the output of amplifier 138 and the negative input of amplifier stage 147 through switches 149 and 151. Switches 149 and 151 operate to connect one side of the capacitor to ground and the other side of the capacitor to the non-grounded pole. A capacitor 153 is disposed in parallel between the input and output of amplifier stage 147 and a switched capacitor 155 is connected in parallel with capacitor 153 through switches 157 and 159. Switches 157 and 159 operate to either connect both plates of capacitor 155 to ground or in parallel with capacitor 153. The output of amplifier stage 147 comprises the output of the third order filter.

In the preferred embodiment, the data is comprised of one-bit data output from the digital delta-sigma modulator, wherein switch 128 is closed as a function of the data input anded with a clock $\psi_2$, and the switch 130 is controlled by the anding of inverted data and clock signal $\psi_2$. This is a conventional operation. The switched capacitor filter operates on a sample rate equal to $64f_s$ and with a $-3$ dB frequency equal to $f_s/2$. The ratio utilized in the preferred embodiment for the capacitors are as follows:

| Capacitor | Ratio |
|---|---|
| 136 | 1 |
| 140 | 19.884 |
| 144 | 1 |
| 134 | 20.372 |
| 142 | 1 |
| 155 | 1 |
| 153 | 19.872 |
| 148 | 1 |
| 120 | 1 |
| 122 | 1 |

In order to determine what the initial low precision filter coefficients are for the present invention, it is first necessary to design the filter utilizing floating point precision FIR low pass filter coefficients. This is done utilizing a very conventional Parks-McClellan design, which coefficients are then processed through a software delta-sigma modulator or quantizer. The frequency response with the floating point coefficients would be as follows:

$$H(e^{j\omega}) = \sum_{n\infty}^{\infty} h[n]e^{j\omega n} \qquad (4)$$

After processing through the software delta-sigma modulator, the following frequency response would occur:

$$\hat{H}(e^{j\omega}) = \sum_{n\infty}^{\infty} \hat{h}[n]e^{j\omega n} \qquad (5)$$

This would result in the response of FIG. 3a. The software delta-sigma modulator is therefore utilized to truncate the floating point precision FIR coefficients to a very low or trivial level in a frequency selective manner, such that the frequency response error due to truncation is gradually concentrated to higher frequencies. This is illustrated by the gradual rise in frequency distortion illustrated in FIG. 3a.

Figure 13:
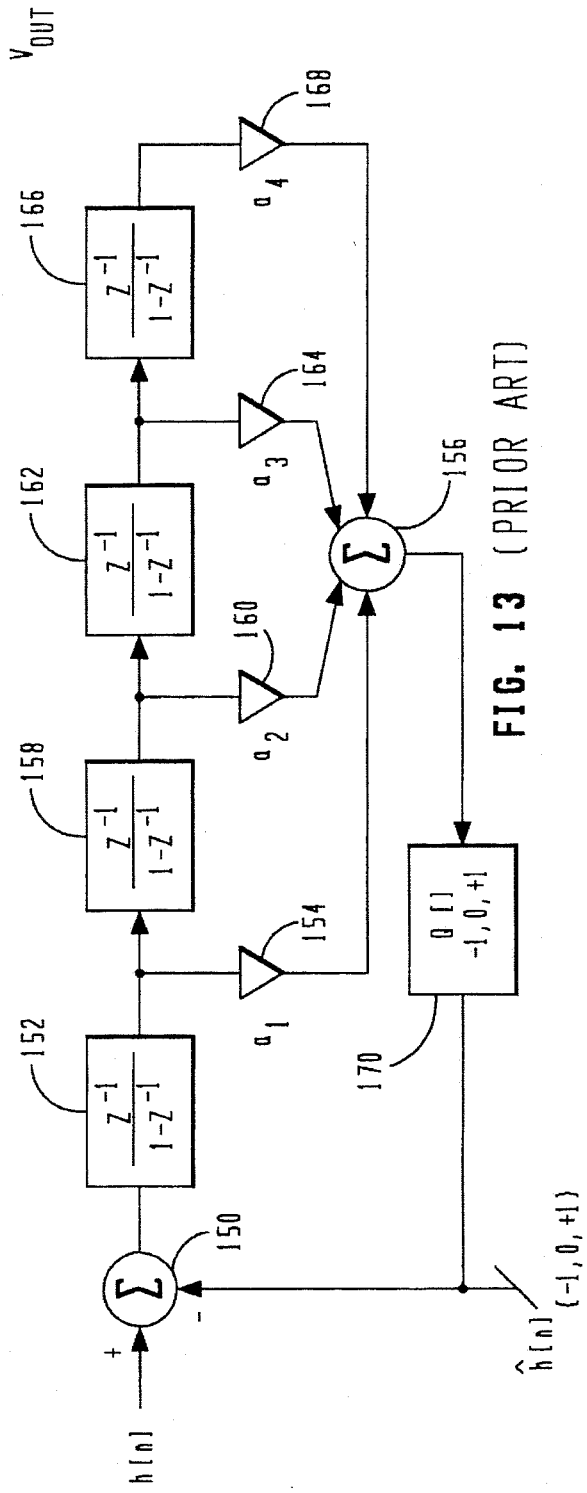
FIG. 13 illustrates a block diagram of the software delta-sigma modulator utilized to generate the low precision coefficients.

The truncation of the floating point precision FIR coefficients has been described in T. W. Wong and R. M. Gray, "FIR Filters with Sigma-Delta Modulation Encoding", *IEEE Trans. on Acous., Speech and Signal Processing*, Vol. 38, pp. 979–990, June 1990, which reference is incorporated herein by reference. Although this paper describes only a first or second order delta-sigma modulator, the preferred embodiment has utilized a fourth order software delta-sigma modulator to quantize the FIR coefficients. This is illustrated in FIG. 13. In FIG. 13, the floating point precision FIR coefficients h[n] are input to a summing block 150, the output of which is input to an accumulator 152. The output of the accumulator is input through a scaling block 154 to a summing block 156 and also to the input of a second accumulator 158. The output of accumulator 158 is input to the summing block 156 through a scaling block 160 and also to the input of a third accumulator 162. The output of the accumulator 162 is input through a scaling block 164 to the summing block 156 and also to the input of a fourth accumulator 166. The output of the fourth accumulator 166 is input through a scaling block 168 to the summing block 156. The summing block 156 sums the outputs of the scaling blocks 154, 160, 164 and 168 and inputs them to a quantizer 170. The quantizer 170 is operable to quantize the output of summing block 156 into the specified number of coefficients, which in the preferred embodiment is restricted to the set $\{-1, 0, +1\}$. The output of the quantizer 170 is then input to the summing block 150, the output of quantizer 170 also representing the low precision filter coefficients.

The state variables that exist at the output of each of the accumulator blocks 152, 158, 162 and 166 are set to an initial value of zero. This was described in the *Wong* and *Gray* reference. However, if the final value of the state variables is not equal to zero, this will result in quantization noise smearing. This can be understood by interpreting the finite length sequence of FIR coefficients as one period of a periodic sequence. Due to the non-linear nature of the Delta-Sigma encoder, the quantization error introduced when encoding a periodic input sequence will not, in general, be periodic. A rectangular window of length equal to one period must be applied to the Delta-Sigma output to isolate a set of low precision FIR coefficients. The consequence of the smearing that results from the existence of this rectangular window is that the stop band attenuation of the low precision coefficient FIR will be limited, since high frequency quantization noise will inevitably be smeared into the sensitive stop band region immediately following the transition band. The solution to this is to force periodicity in the delta-sigma output sequence by forcing the final value of the Delta-Sigma state variables to be equal to zero, which will result in a periodic low precision FIR coefficient sequence. By forcing equivalence of the state variables initial and final values, the noise smearing effects of the rectangular window are nullified. In order to ensure that no more than eight non-zero coefficients exist for any operation, some iterative operations are performed. This can involve manipulating the set of coefficients after calculation thereof, or adjusting the quantizer thresholds in block 170.

Figure 14:
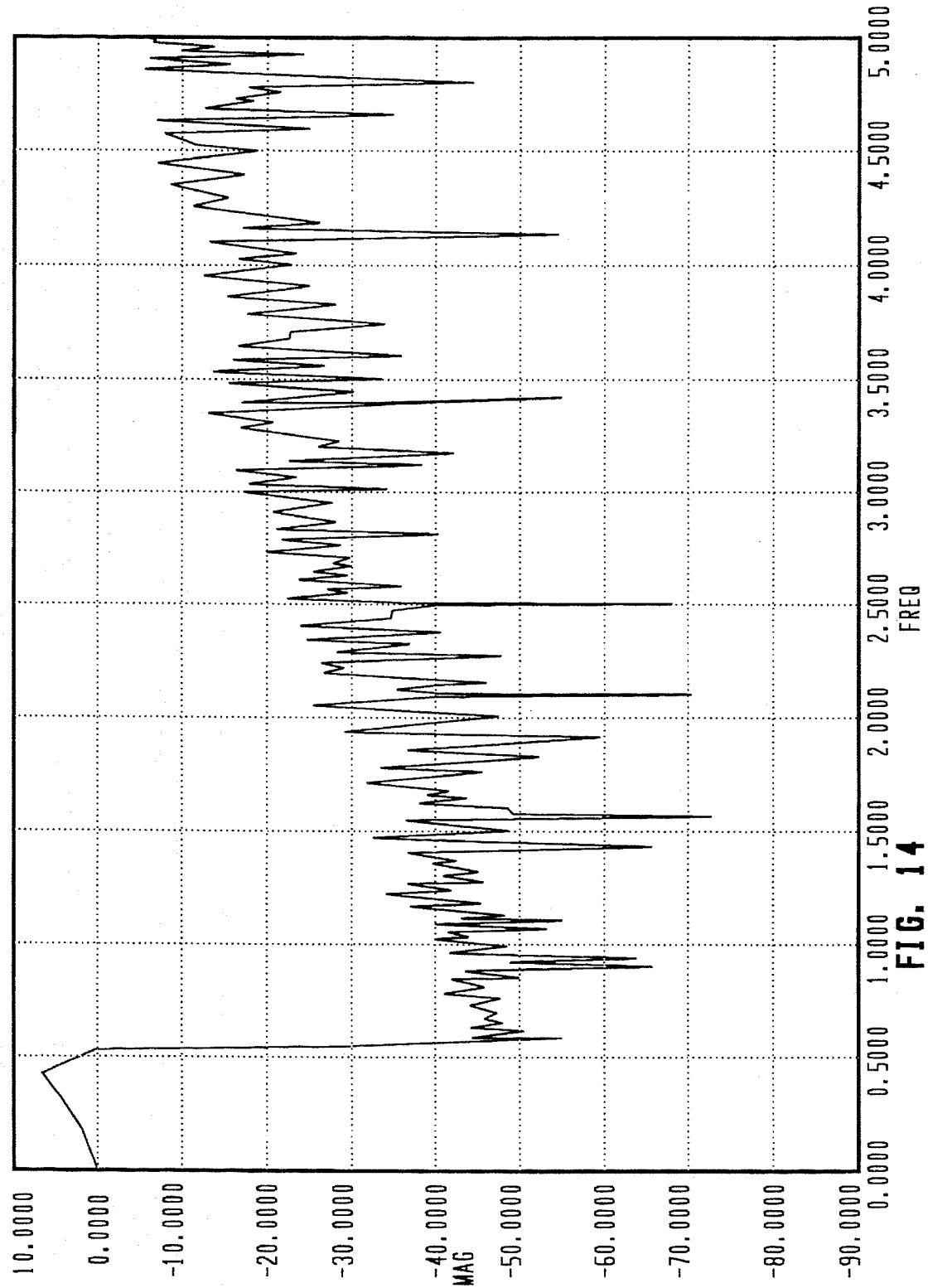
FIGS. 14 and 15 illustrate plots for an example utilizing FIR filter coefficients in the set $\{-1, 0, +1\}$.
Figure 15:
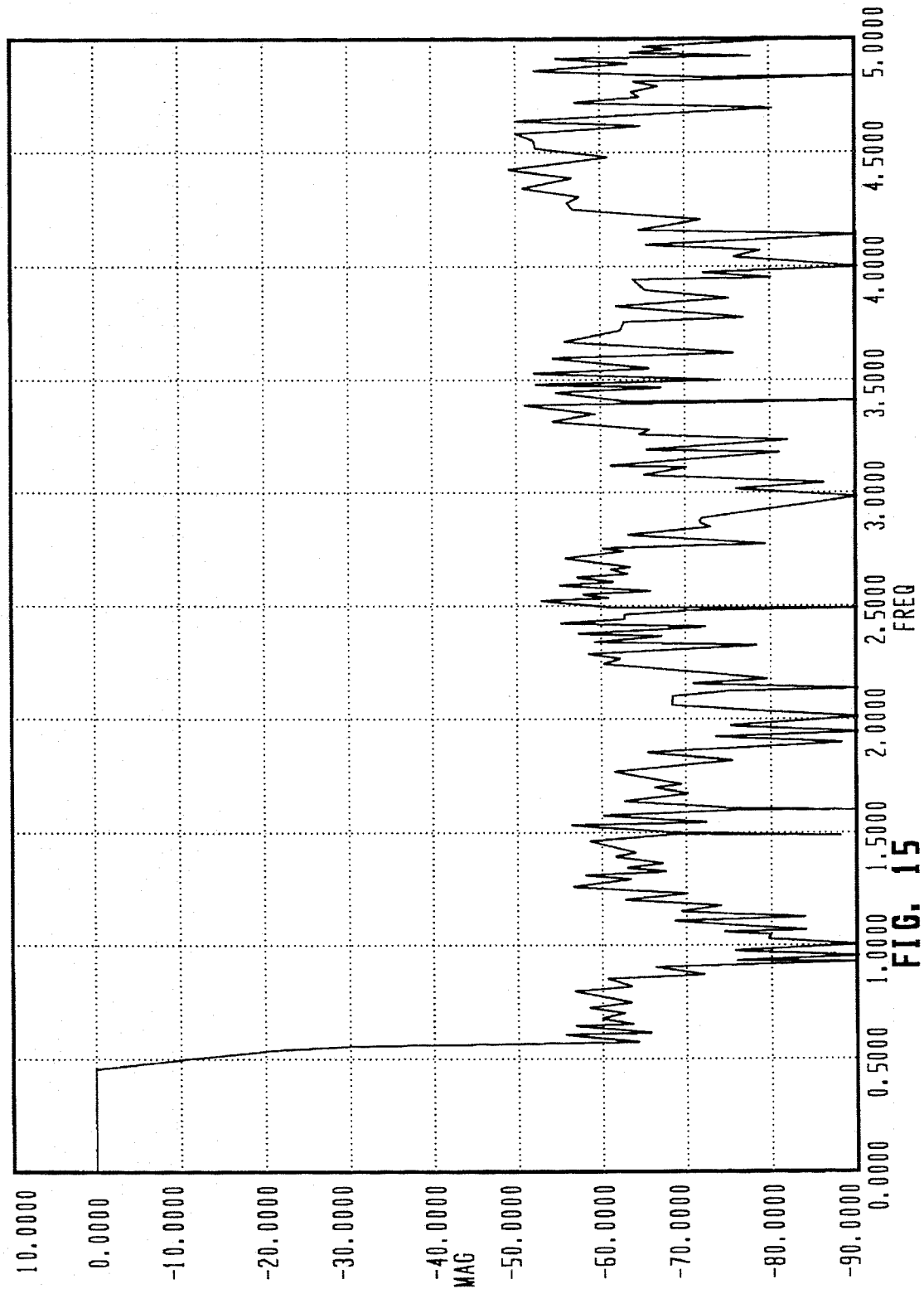

In one example, a 64× interpolation filter was designed, having a multiplier-free FIR length of 1408 taps. The FIR coefficients allowed were −1, 0, and +1. The resulting coefficients are attached as Appendix A. FIG. 14 illustrates the response of the FIR filter 18 where it can be seen that significant stop band rejection is provided immediately after the transition band. It can also be seen that some peaking is provided at the end of the pass band to account for pass band droop as a result of the zero-order hold filter and also to compensate for any attenuation in the switched capacitor filter. FIG. 15 illustrates a plot at the output of the accumulator 82, illustrating further attenuation of the higher frequency images. It can be seen that the zero-order hold circuit places a number of zeroes at the images. The overall response curve for the filter after the analog low pass filtering operation of the low pass filter will result in further attenuation of the higher frequencies.

Although, as noted above, the trivial set of coefficients is restricted to the set of $\{-1, 0, +1\}$ other coefficients having an integer value can also be utilized as part of the non-trivial set. For example, the coefficients could be restricted to the set of $\{-2, -1, 0, +1, +2\}$ or $\{-3, -2, -1, 0, +1, +2, +3\}$. In order to facilitate the use of higher integer values than "1", it will be necessary to perform an arithmetic operation utilizing such a coefficient. The one advantage to the system described hereinabove is that no arithmetic operation is performed other than the accumulation operation. This is due to the fact that only a +1 or a −1 coefficient is utilized, with the "0" coefficient operations being ignored. With a coefficient higher than "1", it is necessary to perform a multiplication with the higher value coefficient. However, in the preferred embodiment, this would merely require additional accumulation operations. For example, if there were eight collected multiplications, then either eight arithmetic operations utilizing a +1 or −1 coefficient could be accommodated or six arithmetic operations involving a +1 or a −1 operation and one involving either a +2 or a −2 operation. When performing the operation for the +1, +2 or −2 operation, it is only necessary to perform the accumulation twice for that input data value, i.e., rather than multiplying by a factor of "2", it is only necessary to add the value twice. For a value of "3", it will be necessary to add the value three times. As such, the set of coefficients can be generated such that for each output, the non-zero coefficients will acquire only a finite number of clock cycles to perform all of the arithmetic operations. This will therefore require one additional zero coefficient if one of the coefficients is a value of "2" and two additional zero coefficients if one of the coefficients is a "3" value. Utilizing higher value coefficients than "1", another degree of versatility is provided through the step of generating the coefficient set.

In summary, there has been provided an arithmetic free interpolation filter that operates with minimum precision FIR coefficients. In the preferred embodiment, only three coefficients in the set of $\{-1, 0, +1\}$ are utilized such that a multiplierless filter can be designed. Further, for each operation, the number of non-zero coefficients for any interpolator output is minimized to a predetermined number. By so limiting the number of non-zero coefficients for any given interpolator output, the number of additions and/or subtractions can be set. In the preferred embodiment, the data is stored in a RAM and then addressed in accordance with the coefficients for any given interpolator output and stored in an accumulator after the sign thereof is changed. Since the number of operations for each interpolator output is known, it is only necessary to increase the clock speed of the accumulation operation and the addressing address of the RAM such that the predetermined number of operations results in a predetermined number of RAM accesses for output thereof and storage in the accumulator during a given operation cycle for a given interpolation output.

Although the preferred embodiment has been described in detail, it should be understood that various changes, substitutions and alterations can be made therein without departing from the spirit and scope of the invention as defined by the appended claims.

| | | | |
|---|---|---|---|
| h[0] = 0 | h[1] = 0 | h[2] = 0 | h[3] = 0 |
| h[4] = 0 | h[5] = 0 | h[6] = 0 | h[7] = 1 |
| h[8] = 0 | h[9] = −1 | h[10] = 0 | h[11] = 0 |
| h[12] = 0 | h[13] = 0 | h[14] = 0 | h[15] = 0 |
| h[16] = 0 | h[17] = 0 | h[18] = 0 | h[19] = 0 |
| h[20] = 0 | h[21] = 0 | h[22] = 0 | h[23] = 1 |
| h[24] = 0 | h[25] = −1 | h[26] = 0 | h[27] = 0 |
| h[28] = 0 | h[29] = 0 | h[30] = 0 | h[31] = 0 |
| h[32] = 1 | h[33] = 0 | h[34] = 0 | h[35] = −1 |
| h[36] = 0 | h[37] = 0 | h[38] = 0 | h[39] = 0 |
| h[40] = 0 | h[41] = 0 | h[42] = 0 | h[43] = 0 |
| h[44] = 0 | h[45] = 0 | h[46] = 0 | h[47] = 1 |
| h[48] = 0 | h[49] = 0 | h[50] = −1 | h[51] = 0 |
| h[52] = 0 | h[53] = 0 | h[54] = 0 | h[55] = 0 |
| h[56] = 0 | h[57] = 0 | h[58] = 0 | h[59] = 0 |
| h[60] = 0 | h[61] = 0 | h[62] = 1 | h[63] = 0 |
| h[64] = −1 | h[65] = 0 | h[66] = 0 | h[67] = 0 |
| h[68] = 0 | h[69] = 0 | h[70] = 0 | h[71] = 0 |
| h[72] = 0 | h[73] = 0 | h[74] = 0 | h[75] = 0 |
| h[76] = 0 | h[77] = 0 | h[78] = 0 | h[79] = 0 |
| h[80] = 0 | h[81] = 0 | h[82] = 0 | h[83] = 0 |
| h[84] = 0 | h[85] = 0 | h[86] = 0 | h[87] = 0 |
| h[88] = 0 | h[89] = 0 | h[90] = 0 | h[91] = 0 |
| h[92] = 0 | h[93] = 0 | h[94] = −1 | h[95] = 0 |
| h[96] = 0 | h[97] = 1 | h[98] = 0 | h[99] = 0 |
| h[100] = 0 | h[101] = 0 | h[102] = 0 | h[103] = 0 |
| h[104] = −1 | h[105] = 0 | h[106] = 0 | h[107] = 1 |
| h[108] = 0 | h[109] = 0 | h[110] = 0 | h[111] = 0 |
| h[112] = 0 | h[113] = 0 | h[114] = −1 | h[115] = 0 |
| h[116] = 0 | h[117] = 1 | h[118] = 0 | h[119] = 0 |
| h[120] = 0 | h[121] = 0 | h[122] = −1 | h[123] = 0 |
| h[124] = 0 | h[125] = 1 | h[126] = 0 | h[127] = 0 |
| h[128] = 0 | h[129] = 0 | h[130] = 0 | h[131] = 0 |
| h[132] = −1 | h[133] = 0 | h[134] = 0 | h[135] = 1 |
| h[136] = 0 | h[137] = 0 | h[138] = 0 | h[139] = 0 |
| h[140] = 0 | h[141] = 0 | h[142] = 0 | h[143] = 0 |
| h[144] = −1 | h[145] = 0 | h[146] = 1 | h[147] = 0 |
| h[148] = 0 | h[149] = 0 | h[150] = 0 | h[151] = 0 |
| h[152] = 0 | h[153] = 0 | h[154] = 0 | h[155] = 0 |
| h[156] = 0 | h[157] = 0 | h[158] = 0 | h[159] = 0 |
| h[160] = 0 | h[161] = 0 | h[162] = 0 | h[163] = 0 |
| h[164] = 0 | h[165] = 1 | h[166] = 0 | h[167] = −1 |
| h[168] = 0 | h[169] = 0 | h[170] = 0 | h[171] = 0 |
| h[172] = 0 | h[173] = 0 | h[174] = 0 | h[175] = 0 |
| h[176] = 1 | h[177] = 0 | h[178] = 0 | h[179] = −1 |
| h[180] = 0 | h[181] = 0 | h[182] = 0 | h[183] = 0 |
| h[184] = 0 | h[185] = 0 | h[186] = 0 | h[187] = 0 |
| h[188] = 0 | h[189] = 1 | h[190] = 0 | h[191] = 0 |
| h[192] = 0 | h[193] = 0 | h[194] = 0 | h[195] = 0 |
| h[196] = 0 | h[197] = 0 | h[198] = 0 | h[199] = 1 |
| h[200] = 0 | h[201] = −1 | h[202] = 0 | h[203] = 0 |
| h[204] = 0 | h[205] = 0 | h[206] = 0 | h[207] = −1 |
| h[208] = 0 | h[209] = 1 | h[210] = 0 | h[211] = 0 |
| h[212] = 0 | h[213] = 0 | h[214] = 0 | h[215] = 0 |
| h[216] = 0 | h[217] = 0 | h[218] = 0 | h[219] = 0 |
| h[220] = −1 | h[221] = 0 | h[222] = 0 | h[223] = 0 |
| h[224] = 1 | h[225] = 0 | h[226] = 0 | h[227] = 0 |
| h[228] = −1 | h[229] = 0 | h[230] = 0 | h[231] = 0 |
| h[232] = 1 | h[233] = 0 | h[234] = 0 | h[235] = −1 |
| h[236] = 0 | h[237] = 0 | h[238] = 0 | h[239] = 0 |
| h[240] = 0 | h[241] = 0 | h[242] = 1 | h[243] = 0 |
| h[244] = 0 | h[245] = −1 | h[246] = 0 | h[247] = 0 |
| h[248] = 0 | h[249] = 0 | h[250] = 0 | h[251] = 0 |
| h[252] = 0 | h[253] = 0 | h[254] = 0 | h[255] = 1 |
| h[256] = 0 | h[257] = 0 | h[258] = −1 | h[259] = 0 |
| h[260] = 0 | h[261] = 0 | h[262] = 0 | h[263] = 0 |
| h[264] = 1 | h[265] = 0 | h[266] = 0 | h[267] = −1 |
| h[268] = 0 | h[269] = 0 | h[270] = 0 | h[271] = 1 |
| h[272] = 0 | h[273] = 0 | h[274] = 0 | h[275] = 0 |
| h[276] = 0 | h[277] = 0 | h[278] = −1 | h[279] = 0 |
| h[280] = 0 | h[281] = 1 | h[282] = 0 | h[283] = 0 |
| h[284] = 1 | h[285] = 0 | h[286] = −1 | h[287] = 0 |
| h[288] = 0 | h[289] = 0 | h[290] = 0 | h[291] = 0 |
| h[292] = 0 | h[293] = 0 | h[294] = 0 | h[295] = 1 |
| h[296] = 0 | h[297] = 0 | h[298] = −1 | h[299] = 0 |
| h[300] = 0 | h[301] = 0 | h[302] = 1 | h[303] = 0 |
| h[304] = 0 | h[305] = 0 | h[306] = 0 | h[307] = −1 |
| h[308] = 0 | h[309] = 0 | h[310] = 0 | h[311] = 1 |
| h[312] = 0 | h[313] = 0 | h[314] = 0 | h[315] = 0 |
| h[316] = 0 | h[317] = 0 | h[318] = −1 | h[319] = 0 |
| h[320] = 0 | h[321] = 1 | h[322] = 0 | h[323] = 0 |
| h[324] = 0 | h[325] = −1 | h[326] = 0 | h[327] = 0 |
| h[328] = 0 | h[329] = 0 | h[330] = 1 | h[331] = 0 |
| h[332] = 0 | h[333] = −1 | h[334] = 0 | h[335] = 0 |
| h[336] = 0 | h[337] = 0 | h[338] = 0 | h[339] = 0 |
| h[340] = 0 | h[341] = 0 | h[342] = 0 | h[343] = 0 |
| h[344] = 0 | h[345] = 0 | h[346] = 0 | h[347] = 0 |
| h[348] = −1 | h[349] = 0 | h[350] = 0 | h[351] = 0 |
| h[352] = 0 | h[353] = 1 | h[354] = 0 | h[355] = 0 |
| h[356] = −1 | h[357] = 0 | h[358] = 0 | h[359] = 0 |
| h[360] = 0 | h[361] = 0 | h[362] = 0 | h[363] = 0 |
| h[364] = −1 | h[365] = 0 | h[366] = 0 | h[367] = 1 |
| h[368] = 0 | h[369] = 0 | h[370] = 0 | h[371] = 0 |
| h[372] = 0 | h[373] = 0 | h[374] = 0 | h[375] = 0 |
| h[376] = −1 | h[377] = 0 | h[378] = 0 | h[379] = 0 |
| h[380] = 0 | h[381] = 1 | h[382] = 0 | h[383] = 0 |
| h[384] = 0 | h[385] = 0 | h[386] = 0 | h[387] = −1 |
| h[388] = 0 | h[389] = 0 | h[390] = 1 | h[391] = 0 |
| h[392] = 0 | h[393] = 0 | h[394] = 0 | h[395] = 0 |
| h[396] = 0 | h[397] = 0 | h[398] = 0 | h[399] = 0 |
| h[400] = 0 | h[401] = 0 | h[402] = 0 | h[403] = 0 |
| h[404] = 1 | h[405] = 0 | h[406] = 0 | h[407] = 0 |
| h[408] = −1 | h[409] = 0 | h[410] = 1 | h[411] = 0 |
| h[412] = 0 | h[413] = 0 | h[414] = 0 | h[415] = 0 |
| h[416] = 0 | h[417] = 1 | h[418] = 0 | h[419] = 0 |
| h[420] = −1 | h[421] = 0 | h[422] = 0 | h[423] = 1 |
| h[424] = 0 | h[425] = 0 | h[426] = 0 | h[427] = 0 |
| h[428] = 0 | h[429] = 0 | h[430] = 0 | h[431] = 1 |
| h[432] = 0 | h[433] = 0 | h[434] = −1 | h[435] = 0 |
| h[436] = 0 | h[437] = 0 | h[438] = 0 | h[439] = 0 |
| h[440] = 0 | h[441] = 1 | h[442] = 0 | h[443] = 0 |
| h[444] = 0 | h[445] = 0 | h[446] = −1 | h[447] = 0 |
| h[448] = 0 | h[449] = 1 | h[450] = 0 | h[451] = 0 |
| h[452] = −1 | h[453] = 0 | h[454] = 0 | h[455] = 0 |
| h[456] = 0 | h[457] = 0 | h[458] = 0 | h[459] = 1 |
| h[460] = 0 | h[461] = −1 | h[462] = 0 | h[463] = 0 |
| h[464] = −1 | h[465] = 0 | h[466] = 0 | h[467] = 0 |
| h[468] = 1 | h[469] = 0 | h[470] = 0 | h[471] = −1 |
| h[472] = 0 | h[473] = 0 | h[474] = 0 | h[475] = −1 |
| h[476] = 0 | h[477] = 0 | h[478] = 1 | h[479] = 0 |
| h[480] = 0 | h[481] = −1 | h[482] = 0 | h[483] = −1 |
| h[484] = 0 | h[485] = 0 | h[486] = 1 | h[487] = 0 |
| h[488] = 0 | h[489] = 0 | h[490] = −1 | h[491] = 0 |
| h[492] = −1 | h[493] = 0 | h[494] = 0 | h[495] = 0 |
| h[496] = 1 | h[497] = 0 | h[498] = 0 | h[499] = 0 |
| h[500] = 1 | h[501] = 0 | h[502] = 0 | h[503] = 0 |
| h[504] = −1 | h[505] = 0 | h[506] = 0 | h[507] = 0 |
| h[508] = 0 | h[509] = 0 | h[510] = 0 | h[511] 0 |
| h[512] = 0 | h[513] = 0 | h[514] = 1 | h[515] = 0 |
| h[516] = 0 | h[517] = −1 | h[518] = 0 | h[519] = 0 |
| h[520] = 0 | h[521] = 0 | h[522] = 1 | h[523] = 0 |
| h[524] = 0 | h[525] = 0 | h[526] = 0 | h[527] = 0 |
| h[528] = 0 | h[529] = 0 | h[530] = 0 | h[531] = 1 |
| h[532] = 0 | h[533] = 0 | h[534] = 0 | h[535] = 0 |
| h[536] = 0 | h[537] = 0 | h[538] = 1 | h[539] = 0 |
| h[540] = 0 | h[541] = 0 | h[542] = 0 | h[543] = 0 |
| h[544] = 0 | h[545] = 0 | h[546] = 1 | h[547] = 0 |
| h[548] = 0 | h[549] = 1 | h[550] = 0 | h[551] = 0 |
| h[552] = 0 | h[553] = −1 | h[554] = 0 | h[555] = 1 |
| h[556] = 0 | h[557] = 0 | h[558] = 1 | h[559] = 0 |
| h[560] = 0 | h[561] = 0 | h[562] = 0 | h[563] = 0 |
| h[564] = 0 | h[565] = 1 | h[566] = 0 | h[567] = 0 |
| h[568] = 0 | h[569] = −1 | h[570] = 0 | h[571] = 0 |
| h[572] = 1 | h[573] = 0 | h[574] = 0 | h[575] = 0 |
| h[576] = 0 | h[577] = 0 | h[578] = 1 | h[579] = 0 |
| h[580] = 0 | h[581] = 0 | h[582] = −1 | h[583] = 0 |
| h[584] = 0 | h[585] = 0 | h[586] = 1 | h[587] = 0 |
| h[588] = 0 | h[589] = −1 | h[590] = 0 | h[591] = −1 |
| h[592] = 0 | h[593] = 0 | h[594] = 0 | h[595] = 0 |
| h[596] = 0 | h[597] = 0 | h[598] = 0 | h[599] = 0 |
| h[600] = −1 | h[601] = 0 | h[602] = −1 | h[603] = 0 |
| h[604] = 0 | h[605] = 0 | h[606] = 0 | h[607] = −1 |
| h[608] = 0 | h[609] = 0 | h[610] = −1 | h[611] = 0 |
| h[612] = 0 | h[613] = 0 | h[614] = −1 | h[615] = 0 |
| h[616] = 0 | h[617] = 0 | h[618] = −1 | h[619] = 0 |
| h[620] = 0 | h[621] = −1 | h[622] = 0 | h[623] = 0 |
| h[624] = 0 | h[625] = −1 | h[626] = 0 | h[627] = 0 |
| h[628] = 0 | h[629] = 0 | h[630] = 0 | h[631] = −1 |
| h[632] = 0 | h[633] = −1 | h[634] = 0 | h[635] = −1 |
| h[636] = 1 | h[637] = 0 | h[638] = 0 | h[639] = −1 |

| | | | |
|---|---|---|---|
| h[640] = 0 | h[641] = 0 | h[642] = 0 | h[643] = 0 |
| h[644] = −1 | h[645] = 0 | h[646] = 1 | h[647] = 0 |
| h[648] = 0 | h[649] = 1 | h[650] = 0 | h[651] = 0 |
| h[652] = 0 | h[653] = 0 | h[654] = −1 | h[655] = 0 |
| h[656] = 1 | h[657] = 1 | h[658] = 0 | h[659] = 1 |
| h[660] = 0 | h[661] = 0 | h[662] = 0 | h[663] = 1 |
| h[664] = 0 | h[665] = 1 | h[666] = 0 | h[667] = 0 |
| h[668] = 1 | h[669] = 1 | h[670] = 0 | h[671] = 1 |
| h[672] = 0 | h[673] = 1 | h[674] = 0 | h[675] = 1 |
| h[676] = 1 | h[677] = 1 | h[678] = 0 | h[679] = 1 |
| h[680] = 0 | h[681] = 1 | h[682] = 1 | h[683] = 1 |
| h[684] = 1 | h[685] = 1 | h[686] = 0 | h[687] = 1 |
| h[688] = 1 | h[689] = 1 | h[690] = 0 | h[691] = 1 |
| h[692] = 1 | h[693] = 1 | h[694] = 1 | h[695] = 1 |
| h[696] = 1 | h[697] = 1 | h[698] = 1 | h[699] = 1 |
| h[700] = 1 | h[701] = 0 | h[702] = 1 | h[703] = 1 |
| h[704] = 1 | h[705] = 1 | h[706] = 1 | h[707] = 1 |
| h[708] = 0 | h[709] = 1 | h[710] = 1 | h[711] = 1 |
| h[712] = 1 | h[713] = 1 | h[714] = 1 | h[715] = 1 |
| h[716] = 1 | h[717] = 1 | h[718] = 1 | h[719] = 0 |
| h[720] = 1 | h[721] = 1 | h[722] = 1 | h[723] = 1 |
| h[724] = 0 | h[725] = 1 | h[726] = 0 | h[727] = 1 |
| h[728] = 1 | h[729] = 0 | h[730] = 1 | h[731] = 0 |
| h[732] = 0 | h[733] = 0 | h[734] = 1 | h[735] = 0 |
| h[736] = 1 | h[737] = 0 | h[738] = 0 | h[739] = 1 |
| h[740] = 0 | h[741] = 1 | h[742] = 0 | h[743] = 0 |
| h[744] = 1 | h[745] = 0 | h[746] = 0 | h[747] = 0 |
| h[748] = 0 | h[749] = 0 | h[750] = 0 | h[751] = 0 |
| h[752] = 0 | h[753] = 1 | h[754] = 0 | h[755] = 0 |
| h[756] = 0 | h[757] = 0 | h[758] = 0 | h[759] = 0 |
| h[760] = −1 | h[761] = 0 | h[762] = 0 | h[763] = 0 |
| h[764] = 0 | h[765] = 0 | h[766] = 0 | h[767] = 0 |
| h[768] = 0 | h[769] = −1 | h[770] = 0 | h[771] = −1 |
| h[772] = 0 | h[773] = 0 | h[774] = 0 | h[775] 0 |
| h[776] = 0 | h[777] = −1 | h[778] = 0 | h[779] = −1 |
| h[780] = 0 | h[781] = 0 | h[782] = 0 | h[783] = −1 |
| h[784] = 0 | h[785] = 0 | h[786] = −1 | h[787] = 0 |
| h[788] = 0 | h[789] = −1 | h[790] = 0 | h[791] = 0 |
| h[792] = 0 | h[793] = −1 | h[794] = 0 | h[795] = −1 |
| h[796] = 0 | h[797] = 0 | h[798] = 0 | h[799] = −1 |
| h[800] = 0 | h[801] = 0 | h[802] = 0 | h[803] = 0 |
| h[804] = −1 | h[805] = 0 | h[806] = 0 | h[807] = −1 |
| h[808] = 0 | h[809] = 0 | h[810] = 0 | h[811] = 0 |
| h[812] = 0 | h[813] = −1 | h[814] = 0 | h[815] = 0 |
| h[816] = 0 | h[817] = 0 | h[818] = 0 | h[819] = 0 |
| h[820] = 0 | h[821] = 0 | h[822] = 0 | h[823] = 0 |
| h[824] = 0 | h[825] = −1 | h[826] = 0 | h[827] = 0 |
| h[828] = 1 | h[829] = 0 | h[830] = 0 | h[831] = 0 |
| h[832] = 0 | h[833] = 0 | h[834] = 0 | h[835] = 0 |
| h[836] = 0 | h[837] = 0 | h[838] = 0 | h[839] = 0 |
| h[840] = 1 | h[841] = 0 | h[842] = 0 | h[843] = 0 |
| h[844] = 0 | h[845] = 0 | h[846] = 0 | h[847] = 1 |
| h[848] = 0 | h[849] = 0 | h[850] = 0 | h[851] = 1 |
| h[852] = 0 | h[853] = 0 | h[854] = 0 | h[855] = 0 |
| h[856] = 0 | h[857] = 0 | h[858] = 0 | h[859] = 0 |
| h[860] = 1 | h[861] = 0 | h[862] = 0 | h[863] = 1 |
| h[864] = 0 | h[865] = 0 | h[866] = 0 | h[867] = 0 |
| h[868] = 0 | h[869] = 0 | h[870] = 0 | h[871] = 1 |
| h[872] = 0 | h[873] = 0 | h[874] = 0 | h[875] = 0 |
| h[874] = 0 | h[877] = 0 | h[878] = 1 | h[879] = 0 |
| h[876] = 0 | h[881] = 0 | h[882] = 0 | h[883] = −1 |
| h[880] = 0 | h[885] = 1 | h[886] = 0 | h[887] = 0 |
| h[884] = 0 | h[889] = 0 | h[890] = 0 | h[891] = 0 |
| h[888] = 0 | h[893] = 0 | h[894] = −1 | h[895] = 0 |
| h[892] = 1 | h[897] = 0 | h[898] = 0 | h[899] = 0 |
| h[896] = 0 | h[901] = −1 | h[902] = 0 | h[903] = 1 |
| h[900] = 0 | h[905] = 0 | h[906] = 0 | h[907] = −1 |
| h[904] = 0 | h[909] = 0 | h[910] = 0 | h[911] = 0 |
| h[908] = 0 | h[913] = 0 | h[914] = 0 | h[915] = 0 |
| h[912] = 0 | h[917] = −1 | h[918] = 0 | h[919] = 0 |
| h[916] = 0 | h[921] = 0 | h[922] = 0 | h[923] = 0 |
| h[920] = 0 | h[925] = −1 | h[926] = 0 | h[927] = 0 |
| h[924] = 0 | h[929] = 0 | h[930] = 0 | h[931] = 0 |
| h[928] = 0 | h[933] = 0 | h[934] = −1 | h[935] = 0 |
| h[936] = 0 | h[937] = 0 | h[938] = 0 | h[939] = 1 |
| h[940] = 0 | h[941] = −1 | h[942] = 0 | h[943] = 0 |
| h[944] = 0 | h[945] = 0 | h[946] = 1 | h[947] = 0 |
| h[948] = 0 | h[949] = −1 | h[950] = 0 | h[951] = 0 |
| h[952] = 0 | h[953] = 1 | h[954] = 0 | h[955] = 0 |
| h[956] = −1 | h[957] = 0 | h[958] = 0 | h[959] = 0 |
| h[960] = 0 | h[961] = 0 | h[962] = 0 | h[963] = 0 |
| h[964] = 0 | h[965] = 0 | h[966] = 0 | h[967] = 0 |
| h[968] = 0 | h[969] = 1 | h[970] = −1 | h[971] = 0 |
| h[972] = 0 | h[973] = 1 | h[974] = 0 | h[975] = 0 |
| h[976] = 0 | h[977] = 0 | h[978] = 0 | h[979] = 0 |
| h[980] = 0 | h[981] = 0 | h[982] = 1 | h[983] = 0 |
| h[984] = 0 | h[985] = 0 | h[986] = 0 | h[987] = −1 |
| h[988] = 0 | h[989] = 1 | h[990] = 0 | h[991] = 0 |
| h[992] = 0 | h[993] = −1 | h[993] = 0 | h[995] = 0 |
| h[996] = 0 | h[997] = 0 | h[998] = 0 | h[999] = −1 |
| h[1000] = 1 | h[1001] = 0 | h[1002] = 0 | h[1003] = 0 |
| h[1004] = 0 | h[1005] = 0 | h[1006] = 0 | h[1007] = 0 |
| h[1008] = 0 | h[1009] = 0 | h[1010] = 0 | h[1011] = 0 |
| h[1012] = −1 | h[1013] = 0 | h[1014] = 0 | h[1015] = 0 |
| h[1016] = 1 | h[1017] = 0 | h[1018] = 0 | h[1019] = 0 |
| h[1020] = −1 | h[1021] = 0 | h[1022] = 0 | h[1023] = 0 |
| h[1024] = 1 | h[1025] = 0 | h[1026] = 0 | h[1027] = −1 |
| h[1028] = 0 | h[1029] = 0 | h[1030] = 0 | h[1031] = 0 |
| h[1032] = 0 | h[1033] = 0 | h[1034] = 1 | h[1035] = 0 |
| h[1036] = 0 | h[1037] = −1 | h[1038] = 0 | h[1039] 0 |
| h[1040] = 0 | h[1041] = 0 | h[1042] = 0 | h[1043] = 0 |
| h[1044] = 0 | h[1045] = 0 | h[1046] = 0 | h[1047] = 1 |
| h[1048] = 0 | h[1049] = 0 | h[1050] = −1 | h[1051] = 0 |
| h[1052] = 0 | h[1053] = 0 | h[1054] = 0 | h[1055] = 0 |
| h[1056] = 0 | h[1057] = 0 | h[1058] = 0 | h[1059] = 0 |
| h[1060] = 0 | h[1061] = 0 | h[1062] = 0 | h[1063] = 0 |
| h[1064] = 0 | h[1065] = −1 | h[1066] = 0 | h[1067] = 0 |
| h[1068] = 0 | h[1069] = 0 | h[1070] = 0 | h[1071] = 0 |
| h[1072] = 0 | h[1073] = 0 | h[1074] = 0 | h[1075] = 0 |
| h[1076] = 0 | h[1077] = 0 | h[1078] = 0 | h[1079] = 1 |
| h[1080] = 0 | h[1081] = 0 | h[1082] = 0 | h[1083] = 0 |
| h[1084] = 0 | h[1085] = 0 | h[1086] = 1 | h[1087] = 0 |
| h[1088] = 1 | h[1089] = 0 | h[1090] = 0 | h[1091] = −1 |
| h[1092] = 0 | h[1093] = 0 | h[1094] = 0 | h[1095] = 0 |
| h[1096] = 0 | h[1097] = 0 | h[1098] = 0 | h[1099] = 1 |
| h[1100] = 0 | h[1101] = 0 | h[1102] = 0 | h[1103] = 0 |
| h[1104] = 0 | h[1105] = 0 | h[1106] = −1 | h[1107] = 0 |
| h[1108] = 0 | h[1109] = 0 | h[1110] = 0 | h[1111] = 0 |
| h[1112] = 0 | h[1113] = 0 | h[1114] = 0 | h[1115] = 0 |
| h[1116] = 0 | h[1117] = 0 | h[1118] = 1 | h[1119] = 0 |
| h[1120] = −1 | h[1121] = 0 | h[1122] = 0 | h[1123] = 0 |
| h[1124] = 0 | h[1125] = 0 | h[1126] = 0 | h[1127] = 0 |
| h[1128] = 0 | h[1129] = 0 | h[1130] = 0 | h[1131] = 0 |
| h[1132] = 0 | h[1133] = 0 | h[1134] = 0 | h[1135] = 0 |
| h[1136] = 0 | h[1137] = 0 | h[1138] = 0 | h[1139] = 0 |
| h[1140] = 0 | h[1141] = 0 | h[1142] = 0 | h[1143] = 0 |
| h[1144] = 0 | h[1145] = 0 | h[1146] = 0 | h[1147] = 0 |
| h[1148] = 0 | h[1149] = 0 | h[1150] = −1 | h[1151] = 0 |
| h[1152] = 0 | h[1153] = 1 | h[1154] = 0 | h[1155] = 0 |
| h[1156] = 0 | h[1157] = 0 | h[1158] = 0 | h[1159] = 0 |
| h[1160] = −1 | h[1161] = 0 | h[1162] = 0 | h[1163] = −1 |
| h[1164] = 0 | h[1165] = 0 | h[1166] = 0 | h[1167] = 0 |
| h[1168] = 0 | h[1169] = 0 | h[1170] = −1 | h[1171] = 0 |
| h[1172] = 0 | h[1173] = 1 | h[1174] = 0 | h[1175] = 0 |
| h[1176] = 0 | h[1177] = 0 | h[1178] = −1 | h[1179] = 0 |
| h[1180] = 0 | h[1181] = 1 | h[1182] = 0 | h[1183] = 0 |
| h[1184] = 0 | h[1185] = 0 | h[1186] = 0 | h[1187] = 0 |
| h[1188] = −1 | h[1189] = 0 | h[1190] = 0 | h[1191] = 1 |
| h[1192] = 0 | h[1193] = 0 | h[1194] = 0 | h[1195] = 0 |
| h[1196] = 0 | h[1197] = 0 | h[1198] = 0 | h[1199] = 0 |
| h[1200] = −1 | h[1201] = 0 | h[1202] = 1 | h[1203] = 0 |
| h[1204] = 0 | h[1205] = 0 | h[1206] = 0 | h[1207] = 0 |
| h[1208] = 0 | h[1209] = 0 | h[1210] = 0 | h[1211] = 0 |
| h[1212] = 0 | h[1213] = 0 | h[1214] = 0 | h[1215] = 0 |
| h[1216] = 0 | h[1217] = 0 | h[1218] = 0 | h[1219] = 0 |
| h[1220] = 0 | h[1221] = 1 | h[1222] = 0 | h[1223] = −1 |
| h[1224] = 0 | h[1225] = 0 | h[1226] = 0 | h[1227] = 0 |
| h[1228] = 0 | h[1229] = 0 | h[1230] = 0 | h[1231] = 0 |
| h[1232] = 1 | h[1233] = 0 | h[1234] = 0 | h[1235] = −1 |
| h[1236] = 0 | h[1237] = 0 | h[1238] = 0 | h[1239] = 0 |
| h[1240] = 0 | h[1241] = 0 | h[1242] = 0 | h[1243] = 0 |
| h[1244] = 1 | h[1245] = 0 | h[1246] = −1 | h[1247] = 0 |
| h[1248] = 0 | h[1249] = 0 | h[1250] = 0 | h[1251] = 0 |
| h[1252] = 0 | h[1253] = 0 | h[1254] = 0 | h[1255] = 0 |
| h[1256] = 0 | h[1257] = −1 | h[1258] = 0 | h[1259] = 0 |
| h[1260] = 0 | h[1261] = 0 | h[1262] = 0 | h[1263] = −1 |
| h[1264] = 0 | h[1265] = 1 | h[1266] = 0 | h[1267] = 0 |
| h[1268] = 0 | h[1269] = 0 | h[1270] = 0 | h[1271] = 0 |
| h[1272] = 0 | h[1273] = 0 | h[1274] = 0 | h[1275] = 0 |
| h[1276] = −1 | h[1277] = 0 | h[1278] = 0 | h[1279] = 0 |

-continued

| | | | |
|---|---|---|---|
| h[1280] = 1 | h[1281] = 0 | h[1282] = 0 | h[1283] = 0 |
| h[1284] = −1 | h[1285] = 0 | h[1286] = 0 | h[1287] = 0 |
| h[1288] = 1 | h[1289] = 0 | h[1290] = 0 | h[1291] = −1 |
| h[1292] = 0 | h[1293] = 0 | h[1294] = 0 | h[1295] = 0 |
| h[1296] = 0 | h[1297] = 0 | h[1298] = 1 | h[1299] = 0 |
| h[1300] = 0 | h[1301] = −1 | h[1302] = 0 | h[1303] 0 |
| h[1304] = 0 | h[1305] = 0 | h[1306] = 0 | h[1307] = 0 |
| h[1308] = 0 | h[1309] = 0 | h[1310] = 0 | h[1311] = 1 |
| h[1312] = 0 | h[1313] = 0 | h[1314] = −1 | h[1315] = 0 |
| h[1316] = 0 | h[1317] = 0 | h[1318] = 0 | h[1319] = 0 |
| h[1320] = 0 | h[1321] = 0 | h[1322] = 0 | h[1323] = 0 |
| h[1324] = 0 | h[1325] = 0 | h[1326] = 0 | h[1327] = 0 |
| h[1328] = 0 | h[1329] = −1 | h[1330] = 0 | h[1331] = 0 |
| h[1332] = 0 | h[1333] = 0 | h[1334] = 0 | h[1335] = 0 |
| h[1336] = 0 | h[1337] = 0 | h[1338] = 0 | h[1339] = 0 |
| h[1340] = 0 | h[1341] = 0 | h[1342] = 0 | h[1343] = 1 |
| h[1344] = 0 | h[1345] = 0 | h[1346] = 0 | h[1347] = 0 |
| h[1348] = 0 | h[1349] = 0 | h[1350] = 1 | h[1351] = 0 |
| h[1352] = 1 | h[1353] = 0 | h[1354] = 0 | h[1355] = −1 |
| h[1356] = 0 | h[1357] = 0 | h[1358] = 0 | h[1359] = 0 |
| h[1360] = 0 | h[1361] = 0 | h[1362] = 0 | h[1363] = 1 |
| h[1364] = 0 | h[1365] = 0 | h[1366] = 0 | h[1367] = 0 |
| h[1368] = 0 | h[1369] = 0 | h[1370] = −1 | h[1371] = 0 |
| h[1372] = 0 | h[1373] = 0 | h[1374] = 0 | h[1375] = 0 |
| h[1376] = 0 | h[1377] = 0 | h[1378] = 0 | h[1379] = 0 |
| h[1380] = 0 | h[1381] = 0 | h[1382] = 1 | h[1383] = 0 |
| h[1384] = −1 | h[1385] = 0 | h[1386] = 0 | h[1387] = 0 |
| h[1388] = 0 | h[1389] = 0 | h[1390] = 0 | h[1391] = 0 |
| h[1392] = 0 | h[1393] = 0 | h[1394] = 0 | h[1395] = 0 |
| h[1396] = 0 | h[1397] = 0 | h[1398] = 0 | h[1399] = 0 |
| h[1400] = 0 | h[1401] = 0 | h[1402] = 0 | h[1403] = 0 |
| h[1404] = 0 | h[1405] = 0 | h[1406] = 0 | h[1407] = 0 |

What is claimed is:

1. A digital filter for filtering a digital input signal at a sampling frequency comprised of a sequence of digital input values and providing a digital filter output signal comprised of a plurality of digital outputs, one for each of the digital input values, comprising:

a first memory device for storing a portion of the sequence of digital input values;

a second memory device for storing filter coefficients associated with a Finite Impulse Response (FIR) filter function, said filter coefficients restricted to only discrete values, each of the digital outputs requiring a predetermined number of arithmetic operations to be performed between predetermined ones of the digital input values and predetermined ones of said filter coefficients stored in said second memory device, of which at least one of said arithmetic operations for each of the digital outputs results in a zero value;

an operational device for performing for each of the digital outputs each of said associated arithmetic operations with the exception of said associated at least one arithmetic operation; and an accumulator for accumulating the results of all of said arithmetic operations performed by said operational device for each of the digital outputs and outputting the resulting digital output after accumulation of all of said associated performed arithmetic operations.

2. The digital filter of claim 1, wherein said filter coefficients include a plurality of zero filter coefficients.

3. The digital filter of claim 2, wherein said at least one arithmetic operation which results in a zero value, is one of said arithmetic operations associated with said zero filter coefficients.

4. The digital filter of claim 2, wherein a defined number of said predetermined number of said arithmetic operations are associated with zero value filter coefficients and said operational device is operable to perform only the ones of said arithmetic operations not including said defined number of said predetermined number of arithmetic operations.

5. The digital filter of claim 4, wherein said operational device is operable to sequentially perform said arithmetic operations.

6. The digital filter of claim 1, wherein non-zero filter coefficients are restricted to either a "−1" or a "+1" value, and wherein said operational device is operable to change the sign of the associated stored sample from said first memory device when said associated filter coefficient is a "−1" value for input to said accumulator and said operational device is operable to directly input the associated sample from said first memory device to said accumulator when said associated filter coefficient is a "+1" value.

7. The digital filter of claim 1, wherein said first memory device comprises a random access memory having a plurality of storage locations that are addressable by an external address, and wherein:

said second memory device comprises an address/command memory having a plurality of storage locations associated therewith for storing a sequence of addresses for said random access memory for each of the digital outputs and, in association with each of said addresses, an arithmetic command representing the arithmetic operation to be performed in accordance with an associated one of said filter coefficients;

said operational device comprising an arithmetic device for receiving the output of said random access memory when addressing an output therefrom for performing an arithmetic operation indicated by said arithmetic command; and said operational device operable to sequence said address/command memory to output said addresses and said associated arithmetic commands in order to select one of the stored samples in said random access memory for input to said arithmetic device and perform the operation of said associated arithmetic command and output the result of said arithmetic device to said accumulator for accumulation thereof during the sequencing of the addresses stored in said address/command memory for a given one of the digital outputs.

8. The digital filter of claim 7, wherein said filter coefficients are restricted to the set {−1, 0, +1} and said arithmetic device is operable to change the sign of said addressed sample from said random access memory when said associated filter coefficient is a "−1" value for input to said accumulator and directly input said addressed sample to said accumulator when said associated filter coefficient is a "+1" value and input a "0" value to said accumulator when said assosiated filter coefficient is a "0" value.

9. The digital filter of claim 7, wherein a defined number of said predetermined number of arithmetic operations for each of the digital outputs are associated with zero filter coefficients, with the sequence of addresses for each of the digital outputs stored in said address/command memory being those associated with the ones of said predetermined number of arithmetic operations not including said defined ones of said predetermined number of arithmetic operations, such that the number of arithmetic operations performed by said arithmetic devices is reduced by a defined number of arithmetic operations.

10. The digital filter of claim 1, and further comprising an output filter for filtering the output of said accumulator, said output filter having a low pass filter function.

11. The digital filter of claim 10, wherein said low-pass filter has a predetermined pass-band droop and said filter coefficients associated with said FIR filter function compensate for said pass-band droop.

12. The digital filter of claim 10, wherein said low pass filter has a predetermined phase response and said filter coefficients associated with said FIR filter functions compensate for said phase response.

13. The digital filter of claim 10, wherein said accumulator comprises a portion of said low-pass filter function.

14. The digital filter of claim 1, and further comprising an interpolation device for interpolating the sequence of digital values to a higher sampling frequency.

15. The digital filter of claim 14, wherein said interpolation device is operable to intersperse zero values between the values in the sequence of digital input values prior to filtering thereof and said operational device is operable to exclude the arithmetic operations associated with said interspersed zero values.

16. A digital interpolation filter for filtering a digital input signal at a first sampling frequency comprised of a sequence of digital values and providing a filtered digital output for each of the digital values, comprising:

a random access memory having a plurality of storage locations for storing the digital values of the digital input signal, each of said storage locations randomly addressable by an external address for output from said random access memory;

a first memory device for storing a plurality of sequences of filter coefficients as filter coefficient sequences, each of said filter coefficient sequences associated with one of the digital outputs and each comprising the filter coefficients of a finite impulse response (FIR) filter function necessary to calculate the associated digital output;

a second memory device for storing a plurality of sequences of addresses for said random access memory as address sequences, each of said address sequences associated with one of said filter coefficient sequences in said first memory device and each of said addresses in each of said address sequences being associated with the corresponding one of said filter coefficients in the corresponding one of said filter coefficient sequences in said first memory device;

an arithmetic device for multiplying the addressed output of said random access memory with the value represented by the output of said first memory device;

an accumulator for accumulating the output of said arithmetic device; and a control device for controlling said second memory device to sequence through the addresses in each of said address sequences in a sequential manner for addressing of said random access memory and to sequentially output from said random access memory the associated one of said stored samples to said arithmetic device, said control device controlling said first memory device to output to said arithmetic device the one of said filter coefficients corresponding to the output one of said addresses from said second memory device, the output of said accumulator at the end of each of said sequences comprising the digital output for the associated input digital value.

17. The digital filter of claim 16, wherein said filter coefficients are restricted to the set of {+1, 0, −1} and said arithmetic device is operable to change the sign of the output sample from said random access memory whenever the output one of said filter coefficients is a "−1" value, to directly input the output of said random access memory to said accumulator when the value of said filter coefficient is "+1" and to input a "0" value to said accumulator wherever said filter coefficient output from said first memory device is a "0" value.

18. The digital filter of claim 17, wherein said first memory device and said second memory device comprise a read only memory having a plurality of addressable storage locations, each of said addressable storage locations having stored therein the one of the addresses stored in said second memory device and the associated one of said filter coefficients stored in said first memory device and said control device operable to sequentially sequence through the addressable storage locations in said read only memory.

19. The digital filter of claim 16, wherein all of said digital outputs each have a predetermined number of arithmetic operations associated therewith and wherein a defined number of said filter coefficients are set to a "0" value for each of the digital outputs such that said address sequences only include addresses for the ones of said arithmetic operations not associated with said defined number of said filter coefficients having a "0" value.

20. The digital filter of claim 16, and further comprising an interpolation device for interpolating the sequence of digital values to a higher sampling frequency.

21. The digital filter of claim 20, wherein said interpolation device is operable to interpolate a zero value between the values in the sequence of digital values prior to filtering thereof, and said arithmetic device is operable to exclude the arithmetic operation associated with said interspersed zero values.

22. A processor for processing a time series of digital values, which digital values are in a predetermined sequence, comprising:

an input associated with each of the digital values;

an output associated with each of the digital values to provide a processed output digital value;

a data memory for storing the input digital values;

a coefficient memory for storing a plurality of processing coefficients;

an input selection network for accessing select ones of said stored digital inputs;

a processor element for processing each of said stored digital inputs to provide an associated output in accordance with a predetermined algorithm, said predetermined algorithm requiring as data inputs a plurality of said stored input digital values including said associated digital value, and as coefficient inputs, a plurality of said stored processing coefficients, said data inputs selected by said input selection network, said predetermined algorithm having an arithmetic operation associated with each of said data inputs, with each of said arithmetic operations requiring an associated one of said input processing coefficients to provide a plurality of processed output values for each of said associated digital values; and an accumulator for summing said processed output values for each of said outputs to provide said associated processed output digital value for each of the input digital values;

a processor controller for controlling the processing sequence in which said arithmetic operations are performed for each of said outputs and controlling said input selection network to select the appropriate one of said data inputs, wherein said processing sequence can be different than the sequence in which said associated data inputs occur in the predetermined sequence of the digital values.

23. The processor of claim 22, wherein each of the data inputs associated with each of the outputs is associated with one of said processor coefficients stored in said coefficient memory.

24. The processor of claim 22, wherein said processor coefficients include a plurality of zero processor coefficients.

25. The processor of claim 24, wherein each of said outputs has at least one of said associated arithmetic operations associated with one of said zero processor coefficients, and wherein said processor element is operable to perform only the ones of said arithmetic operations not including the at least one arithmetic operation.

26. The processor of claim 24, wherein said arithmetic operations associated with each of said outputs are the same as for others of said outputs and wherein a defined number of said arithmetic operations for each of said outputs are associated with said zero value processor coefficients and said processor element is operable to perform only the ones of said arithmetic operations not including said defined number of said arithmetic operations associated with said zero value processor coefficients.

27. The processor of claim 26, wherein said processor element is operable to sequentially perform said arithmetic operations for each of said outputs.

28. The processor of claim 22, wherein the ones of said processing coefficients having a non-zero value are restricted to either a "−1" or a "+1" value and wherein said processor element is operable to change the sign of the associated stored digital value when said associated processor coefficient is a "−1" value for input to said accumulator and said processor element is operable to directly input the associated stored digital value in said accumulator when said associated processor coefficient is a "+1" value.

29. The processor of claim 22, wherein said processor element operates on a predetermined number of clock cycles with each clock cycle associated with the performance of an arithmetic operation and wherein the number of non-zero coefficients is restricted to the number of clock cycles for each output to said accumulator wherein each of said outputs has a predetermined number of zero value processor coefficients associated therewith.

30. The processor of claim 22, and further comprising an interpolation device for interpolating the sequence of digital values to a higher sampling frequency.

31. The processor of claim 30, wherein said interpolation device is operable to intersperse zero values between the values of the sequence of digital values prior to processing thereof and said processor element is operable to exclude the arithmetic operation associated with said interspersed values.

32. The processor of claim 22, and further comprising a decimation device for selecting only predetermined ones of said outputs.

33. The processor of claim 32, wherein the ones of said outputs not selected by said decimation output occur on a periodic basis.

34. A digital filter for filtering a digital input signal at a sampling frequency comprised of a sequence of digital input values and providing a digital filter output signal comprised of a plurality of digital outputs, one for each of the digital input values, comprising:

a first memory device for storing a portion of the sequence of digital input values;

a second memory device for storing filter coefficients associated with a Finite Impulse Response (FIR) filter function, said filter coefficients restricted to only discrete values, each of the digital outputs requiring a predetermined number of arithmetic operations to be performed between predetermined ones of the digital input values and predetermined ones of said filter coefficients stored in said second memory device;

a processor clock operating at a higher frequency than the sampling frequency;

an arithmetic processor for performing for each of the digital outputs each of said associated arithmetic operations, each of the arithmetic operations requiring a predetermined number of clock cycles of said processor clock with the total number of clock cycles for all of said arithmetic operation for each of the digital outputs being less than or equal to a single sampling period associated with the sampling frequency; and an accumulator for accumulating the results of all of said arithmetic operations performed by said operational device for each of the digital outputs and outputting the resulting digital output after accumulation of all of said associated performed arithmetic operations.

35. The digital filter of claim 34, wherein at least one of said arithmetic operations for each of the digital outputs is a zero value and said arithmetic processor does not process said at least one of said arithmetic operations.

36. The digital filter of claim 35, wherein said at least one of said arithmetic operations for each of the digital outputs can be different as compared to other of the digital outputs.

37. A method for filtering a digital output signal at a sampling frequency is comprised of a sequence of digital input values and providing a digital filter output signal comprised of a plurality of digital outputs, one for each of the digital input values, comprising the steps of:

storing a portion of the sequence of the digital input values in a first memory device;

storing filter coefficients associated with a finite impulse response (FIR) filter function in a second memory device, the filter coefficients restricted to only discrete values, each of the digital outputs requiring a predetermined number of arithmetic operations to be performed between predetermined ones of the digital input values and predetermined ones of the filter coefficients stored in the second memory device, of which at least one of the arithmetic operations for each of the digital outputs results in a zero value;

performing for each of the digital outputs each of the associated arithmetic operations with the exception of the at least one arithmetic operation; and accumulating the results of all the arithmetic operations performed by the step of performing for each of the digital outputs and outputting the resulting digital output after accumulation of all of the associated performed arithmetic operations.

38. The method of claim 37, wherein the filter coefficients include a plurality of zero filter coefficients.

39. The method of claim 38, wherein the at least one arithmetic operation which results in a zero value is one of the arithmetic operations associated with the zero filter coefficients.

40. The method of claim 38, wherein a defined number of the predetermined arithmetic operations are associated with zero value filter coefficients and the step of performing is operable to perform only the ones of the arithmetic operations not including the defined number of predetermined arithmetic operations.

41. The method of claim 40, wherein the step of performing is operable to sequentially perform the arithmetic operations.

42. The method of claim 37, wherein non-zero filter coefficients are restricted to either a "−1" or a "+1" value, and wherein the step of performing is operable to change the sign of the associated stored input value in the first memory device when the associated filter coefficient is a "−1" value for use in the step of accumulating and the step of performing is operable to directly input the associated input value from the first memory device for use in the step of accumulating when the associated filter coefficient is a "+1" value.

43. The method of claim 37, wherein the step of storing a portion of the sequence of digital input values in the first memory device comprises storing a portion of the sequence of digital input values in a random access memory having a plurality of storage locations that are addressable by an external address, and wherein:

the second memory device comprises an address/command memory having a plurality of storage locations associated therewith for storing a sequence of addresses for the random access memory for each of the digital outputs, and in association with each of the addresses, an arithmetic command representing the arithmetic operation to perform in accordance with an associated one of the filter coefficients;

the step of performing further providing the step of receiving the output of the random access memory and addressing an output therefrom and performing an arithmetic operation thereon indicated by the arithmetic command; and the step of performing operable to sequence the address/command memory to output the addresses and the associated arithmetic commands in order to select one of the stored samples in the random access memory for use in the step of performing the operation of the associated arithmetic command and then outputting the result of the operation of the associated arithmetic command for use in the step of accumulating during the sequencing of the addresses stored in the address/command memory for a given digital output.

44. The method of claim 43, wherein the filter coefficients are restricted to the set {−1, 0, +1} and the step of performing the operation of the associated arithmetic command is operable to change the sign of the addressed sample from the random access memory when the associated filter coefficient is a "+1" value for use in the step of accumulating and directly utilizing the addressed sample for use in the step of accumulating when the associated filter coefficient is a "+1" value and utilizing a "0" value in the step of accumulating when the associated filter coefficient is a "0" value.

45. The method of claim 43, wherein a defined number of the predetermined number of arithmetic operations for each of the digital outputs is associated with a zero coefficient, with the sequence of addresses for each of the digital outputs stored in the address/command memory and those associated with the ones of the predetermined number of arithmetic operations not including the defined ones of the predetermined number of arithmetic operations, such that the number of arithmetic operations performed by the step of performing is reduced by a defined number of arithmetic operations.

46. The method of claim 37, and further comprising the step of filtering the output from the step of accumulation, the step of filtering utilizing a low-pass filter function.

47. The method of claim 46, wherein the step of filtering comprises processing the digital output signal with a low-pass filter that has a predetermined pass-band droop and the filter coefficients associated with the FIR filter function compensate for the pass-band droop.

48. The method of claim 46, wherein the step of filtering comprises in part the step of accumulating.

49. The method of claim 46, and further comprising interpolating the sequence of digital values to a higher sampling frequency.

50. The method of claim 49, wherein the step of interpolating is operable to intersperse zero values between the values in the sequence of digital input values prior to filtering thereof and the step of performing is operable to exclude the arithmetic operations associated with the interspersed zero values.

51. A method for filtering a digital input signal at a sampling frequency comprised of a sequence of digital values and providing a filtered digital output for each of the digital values, comprising the steps of:

providing a random access memory having a plurality of storage locations and storing the digital values of the digital input signals in the storage locations, each of the storage locations randomly addressable by an external address for output from the random access memory;

storing a plurality of sequences of filter coefficients in a first memory device as filter coefficient sequences, each of the filter coefficient sequences associated with one of the digital outputs and each comprising the filter coefficient of a finite impulse response (FIR) filter function necessary to calculate the associated digital output;

storing a plurality of sequences of addresses for the random access memory as address sequences in a second memory device, each of the address sequences associated with one of the filter coefficient sequences in the first memory device and each of the addresses in each of the address sequences being associated with the corresponding ones of the filter coefficients in the corresponding ones of the filter coefficient sequences in the first memory device;

multiplying the addressed output of the random access memory with a value represented by the output of the first memory device in an arithmetic device;

accumulating the output of the arithmetic device in an accumulator; and controlling the second memory device to sequence through the addresses in each of the address sequences in a sequential manner for addressing of the random access memory and to sequentially output from the random access memory and to sequentially output from the random access memory the associated one of the stored samples to the arithmetic device, the step of controlling the first memory device operable to control the first memory device to output to the arithmetic device the one of the filter coefficients corresponding to the output one of the addresses from the second memory device, the output of the accumulator at the end of each of the sequences comprising the digital output for the associated input value.

52. The method of claim 51, wherein the filter coefficients are restricted to the step of {+1, 0, −1} and the step of multiplying with the arithmetic device is operable to change the sign of the output sample from the random access memory whenever the output one of the filter coefficients is a "−1" value, to directly input the output of the random access memory to the accumulator when the value of the filter coefficient is "+1" and to input the "0" value to the accumulator whenever the filter coefficient output from the first memory device is a "0" value.

53. The method of claim 52, wherein the first memory device and the second memory device comprise a Read Only Memory having a plurality of addressable storage locations, each of the addressable storage locations having stored therein the one of the addresses stored in the second memory device and the associated one of the filter coefficients stored in the first memory device, and the step of controlling operable to sequentially sequence through the addressable storage locations in the Read Only Memory.

54. The method of claim 51, wherein all of the digital outputs each have a predetermined number of arithmetic operations associated therewith and wherein a defined number of the filter coefficients are set to a "0" value for each of the digital outputs such that the address sequences only include addresses for the ones of the arithmetic operations not associated with the defined number of the filter coefficients having a "0" value.

55. The method of claim 51, and further comprising, interpolating the sequence of digital values to a higher sampling frequency.

56. The method of claim 55, wherein the step of interpolating is operable to intersperse a zero value between the values in the sequence of digital values prior to filtering thereof, and the step of multiplying operable to exclude the arithmetic operation associated with the interspersed zero value.

57. A method for processing a time series of digital values, which digital values are in a predetermined sequence, comprising the steps of:

inputting each of the digital values on a separate input associated with each of the digital values;

providing an output associated with each of the digital values to provide a processed output digital value;

storing the input digital values in the data memory;

storing a plurality of processing coefficients in a coefficient memory;

accessing select ones of the stored digital inputs with an input selection network;

processing each of the stored digital inputs to provide an associated output in accordance with a predetermined algorithm, the predetermined algorithm requiring as data inputs a plurality of the stored input digital values including the associated digital value and, as coefficient inputs, a plurality of the stored processing coefficients, the data input selected by the data input selection network, the predetermined algorithm having an arithmetic operation associated with each of the data inputs, with each of the arithmetic operations requiring an associated one of the input processing coefficients to provide a plurality of processed output values for each of the associated digital values; and summing the processed output values in an accumulator for each of the outputs to provide the associated processed output digital value for each of the input digital values; and controlling the processing sequence in which the arithmetic operations are performed in the step of processing and controlling the input selection network to select the appropriate one of the data inputs, wherein the processing sequence can be different than the sequence in which the associated data inputs occur in the predetermined sequence of digital values.

\* \* \* \* \*

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 1, line 63, replace "h1], h2]" with --h[1], h[2]--.

Column 2, line 31, replace "KHz" with --kHz--.

Column 15, line 40, replace "h[191] = 0" with --h[191] = -1--

Column 16, line 37, replace "h[492] = 1" with --h[492] = 0--.

Column 16, line 38, replace "h[496] = 1" with --h[496] = -1--.

Column 16, line 40, replace "h[511] 0" with --h[511] = 0--.

Column 17, line 49, replace "h[874] = 0" with --h[876] = 0--.

Column 17, line 50, replace "h[876] = 0" with --h[880] = 0--.

Column 17, line 51, replace "h[880] = 0" with --h[884] = 0--.

Column 17, line 52, replace "h[884] = 0" with --h[888] = 0--.

Column 17, line 53, replace "h[888] = 0" with --h[892] = 1--.

Column 17, line 54, replace "h[892] = 1" with --h[896] = 0--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 17, line 55, replace "h[896] = 0" with --h[900] = 0--.

Column 17, line 56, replace "h[900] = 0" with --h[904] = 0--.

Column 17, line 57, replace "h[904] = 0" with --h[908] = 0--.

Column 17, line 58, replace "h[908] = 0" with --h[912] = 0--.

Column 17, line 59, replace "h[912] = 0" with --h[916] = 0--.

Column 17, line 60, replace "h[916] = 0" with --h[920] = 0--.

Column 17, line 61, replace "h[920] = 0" with --h[924] = 0--.

Column 17, line 62, replace "h[924] = 0" with --h[928] = 0--.

Column 17, line 63, replace "h[928] = 0" with --h[932] = 0--.

Column 17, line 64, replace "h[943] = 0" with --h[943] = -1--.

Column 18, line 9, replace "h[993] = -1" with --h[993] = 0--.

Column 18, line 9, replace "h[993] = 0" with --h[994] = 1--.

Column 18, line 10, replace "h[998] = 0" with --h[998] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 13, replace "h[1010] = 0" with --h[1010] = -1--.

Column 18, line 14, replace "h[1012] = -1" with --h[1012] = 0--.

Column 18, line 15, replace "h[1020] = -1" with --h[1020] = 0--.

Column 18, line 15, replace "h[1021] = 0" with --h[1021] = -1--.

Column 18, line 15, replace "h[1024] = 1" with --h[1024] = 0--

Column 18, line 15, replace "h[1025] = 0" with --h[1025] = 1--.

Column 18, line 15, replace "h[1027] = -1" with --h[1027] = 0--.

Column 18, line 16, replace "h[1031] = 0" with --h[1031] = -1--.

Column 18, line 17, replace "h[1034] = 1" with --h[1034] = 0--.

Column 18, line 18, replace "h[1037] = -1" with --h[1037] = 1--.

Column 18, line 18, replace "h[1039] 0" with --h[1039] = 0--.

Column 18, line 19, replace "h[1040] = 0" with --h[1040] = -1--.

Column 18, line 19, replace "h[1044] = 0" with --h[1044] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 19, replace "h[1046] = 0" with --h[1046] = 1--.

Column 18, line 19, replace "h[1047] = 1" with --h[1047] = 0--.

Column 18, line 20, replace "h[1050] = -1" with --h[1050] = 0--.

Column 18, line 21, replace "h[1053] = 0" with --h[1053] = -1--.

Column 18, line 23, replace "h[1060] = 0" with --h[1060] = 1--.

Column 18, line 23, replace "h[1062] = 0" with --h[1062] = -1--.

Column 18, line 23, replace "h[1065] = -1" with --h[1065] = 0--.

Column 18, line 23, replace "h[1066] = 0" with --h[1066] = -1--.

Column 18, line 24, replace "h[1069] = 0" with --h[1069] = 1--.

Column 18, line 25, replace "h[1073] = 0" with --h[1073] = -1--.

Column 18, line 25, replace "h[1077] = 0" with --h[1077] = 1--.

Column 18, line 25, replace "h[1079] = 1" with --h[1079] = 0--.

Column 18, line 26, replace "h[1080] = 0" with --h[1080] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 28, replace "h[1088] = 1" with --h[1088] = -1--.

Column 18, line 28, replace "h[1091] = -1" with --h[1091] = 0--.

Column 18, line 29, replace "h[1095] = 0" with --h[1095] = 1--.

Column 18, line 29, replace "h[1098] = 0" with --h[1098] = -1--.

Column 18, line 30, replace "h[1103] = 0" with --h[1103] = 1--.

Column 18, line 31, replace "h[1106] = -1" with --h[1106] = 0--.

Column 18, line 31, replace "h[1107] = 0" with --h[1107] = -1--.

Column 18, line 32, replace "h[1110] = 0" with --h[1110] = 1--.

Column 18, line 34, replace "h[1118] = 1" with --h[1118] = 0--.

Column 18, line 34, replace "h[1120] = -1" with --h[1120] = 0--.

Column 18, line 35, replace "h[1129] = 0" with --h[1129] = 1--.

Column 18, line 37, replace "h[1134] = 0" with --h[1134] = -1--.

Column 18, line 38, replace "h[1137] = 0" with --h[113] = 1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 38, replace "h[1143] = 0" with --h[1143] = -1--.

Column 18, line 39, replace "h[1146] = 0" with --h[1146] = 1--.

Column 18, line 40, replace "h[1150] = -1" with --h[1150] = 0--.

Column 18, line 41, replace "h[1153] = 1" with --h[1153] = 0--.

Column 18, line 42, replace "h[1160] = -1" with --h[1160] = 0--.

Column 18, line 42, replace "h[1163] = -1" with --h[1163] = 0--.

Column 18, line 43, replace "h[1164] = 0" with --h[1164] = -1--.

Column 18, line 43, replace "h[1167] = 0" with --h[1167] = 1--.

Column 18, line 44, replace "h[1170] = -1" with --h[1170] = 0--.

Column 18, line 45, replace "h[1173] = 1" with --h[1173] = -1--.

Column 18, line 45, replace "h[1177] = 0" with --h[1177] = 1--.

Column 18, line 45, replace "h[1178] = -1" with --h[1178] = 0--.

Column 18, line 46, replace "h[1181] = 1" with --h[1181] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 48, replace h[1188] = -1" with --h[1188] = 0--.

Column 18, line 48, replace "h[1190] = 0" with --h[1190] = 1--.

Column 18, line 48, replace "h[1191] = 1" with --h[1191] = 0--.

Column 18, line 49, replace "h[1192] = 0" with --h[1192] = -1--.

Column 18, line 50, replace h[1200] = -1" with --h[1200] = 0--.

Column 18, line 50, replace "h[1201] = 0" with --h[1201] = -1--.

Column 18, line 50, replace "h[1202] = 1" with --h[1202] = 0--.

Column 18, line 50, replace "h[1203] = 0" with --h[1203] = 1--.

Column 18, line 52, replace "h[1211] = 0" with --h[1211] = -1--.

Column 18, line 53, replace "h[1214] = 0" with --h[1214] = 1--.

Column 18, line 55, replace "h[1221] = 1" with --h[1221] = -1--.

Column 18, line 55, replace "h[1223] = -1" with --h[1223] = 0--.

Column 18, line 57, replace "h[1232] = 1" with --h[1232] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 18, line 57, replace "h[1235] = -1" with --h[1235] = 1--.

Column 18, line 59, replace "h[1244] = 1" with --h[1244] = 0--.

Column 18, line 59, replace "h[1246] = -1" with --h[1246] = 0--.

Column 18, line 62, replace "h[1257] = -1" with --h[1257] = 0--.

Column 18, line 62, replace "h[1259] = 0" with --h[1259] = 1--.

Column 18, line 63, replace "h[1262] = 0" with --h[1262] = -1--.

Column 18, line 63, replace "h[1263] = -1" with --h[1263] = 0--.

Column 18, line 63, replace "h[1265] = 1" with --h[1265] = 0--.

Column 18, line 65, replace "h[1272] = 0" with --h[1272] = 1--.

Column 19, line 2, replace "h[1280] = 1" with --h[1280] = 0--.

Column 19, line 2, replace "h[1282] = 0" with --h[1282] = 1--.

Column 19, line 3, replace "h[1284] = -1" with --h[1284] = 0--.

Column 19, line 3, replace "h[1285] = 0" with --h-[1285] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 19, line 4, replace "h[1288] = 1" with --h[1288] = 0--.

Column 19, line 4, replace "h[1289] = 0" with --h[1289] = 1--.

Column 19, line 4, replace "h[1291] = -1" with --h[1291] = 0--.

Column 19, line 5, replace "h[1292] = 0" with --h[1292] = -1--.

Column 19, line 6, replace "h[1298] = 1" with --h[1298] = 0--.

Column 19, line 6, replace "h[1299] = 0" with --h[1299] = 1--.

Column 19, line 7, replace "h[1301] = -1" with --h[1301] = 0--.

Column 19, line 7, replace "h[1302] = 0" with --h[1302] = -1--.

Column 19, line 8, replace "h[1310] = 0" with --h[1310] = 1--.

Column 19, line 8, replace "h[1311] = 1" with --h[1311] = 0--.

Column 19, line 9, replace "h[1312] = 0" with --h[1312] = -1--.

Column 19, line 9, replace "h[1314] = -1" with --h[1314] = 0--.

Column 19, line 12, replace "h[1329] = -1" with --h[1329] = 0--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 19, line 13, replace "h[1332] = 0" with --h[1332] = -1--.

Column 19, line 13, replace "h[1334] = 0" with --h[1334] = 1--.

Column 19, line 14, replace "h[1343] = 1" with --h[1343] = 0--.

Column 19, line 15, replace "h[1345] = 0" with --h[1345] = -1--.

Column 19, line 16, replace "h[1348] = 0" with --h[1348] = 1--.

Column 19, line 17, replace "h[1352] = 1" with --h[1352] = 0--.

Column 19, line 17, replace "h[1355] = -1" with --h[1355] = 0--.

Column 19, line 18, replace "h[1357] = 0" with --h[1357] = -1--.

Column 19, line 18, replace "h[1359] = 0" with --h[1359] = 1--.

Column 19, line 18, replace "h[1363] = 1" with --h[1363] = 0--.

Column 19, line 19, replace "h[1364] = 0" with --h[1364] = -1--.

Column 19, line 19, replace "h[1366] = 0" with --h[1366] = 1--.

Column 19, line 20, replace "h[1370] = -1" with --h[1370] = 0--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et al.

It is certified that error appears in the above-indentified patent and that said Letters Patent is hereby corrected as shown below:

Column 19, line 21, replace "h[1373] = 0" with --h[1373] = -1--.

Column 19, line 22, replace "h[1376] = 0" with --h[1376] = 1--.

Column 19, line 23, replace "h[1382] = 1" with --h[1382] = 0--.

Column 19, line 23, replace "h[1384] = -1" with --h[1384] = 0--.

Column 19, line 25, replace "h[1392] = 0" with --h[1392] = -1--.

Column 19, line 25, replace "h[1394] = 0" with --h[1394] = 1--.

Column 19, line 28, replace "h[1405] = 0" with --h[1405] = 1--.

Column 19, line 28, replace "h[1407] = 0" with --h[1407] = -1--.

UNITED STATES PATENT AND TRADEMARK OFFICE
CERTIFICATE OF CORRECTION

PATENT NO. : 5,541,864
DATED : July 30, 1996
INVENTOR(S) : Van Bavel, et. al.

It is certified that error appears in the above-indentified patent and that said Letters Patent is hereby corrected as shown below:

Column 20, line 49, replace "assosiated" with associated--.

Signed and Sealed this

Fourteenth Day of January, 1997

Attest:

BRUCE LEHMAN

*Attesting Officer*   *Commissioner of Patents and Trademarks*